United States Patent
Yano

(10) Patent No.: US 8,027,594 B2
(45) Date of Patent: Sep. 27, 2011

(54) RECEIVING APPARATUS AND ELECTRONIC DEVICE USING THE SAME

(75) Inventor: Shinji Yano, Kyoto (JP)

(73) Assignee: Rohm Co., Ltd. (JP)

( * ) Notice: Subject to any disclaimer, the term of this patent is extended or adjusted under 35 U.S.C. 154(b) by 960 days.

(21) Appl. No.: 11/664,039

(22) PCT Filed: Sep. 27, 2005

(86) PCT No.: PCT/JP2005/017714
§ 371 (c)(1),
(2), (4) Date: Sep. 17, 2007

(87) PCT Pub. No.: WO2006/035754
PCT Pub. Date: Apr. 6, 2006

(65) Prior Publication Data
US 2008/0101802 A1    May 1, 2008

(30) Foreign Application Priority Data

Sep. 28, 2004  (JP) ................ 2004-282512
Oct. 7, 2004   (JP) ................ 2004-295301
Apr. 11, 2005  (JP) ................ 2005-113088

(51) Int. Cl.
H04B 10/06  (2006.01)
(52) U.S. Cl. ........ 398/202; 398/203; 398/204; 398/206; 398/208
(58) Field of Classification Search ............ 398/106, 398/202, 203, 204, 206, 208
See application file for complete search history.

(56) References Cited

U.S. PATENT DOCUMENTS

| 4,467,192 A * | 8/1984 | Velo ............... 250/214 A |
| 5,550,797 A * | 8/1996 | Kimura et al. ...... 369/44.41 |
| 6,384,946 B1 * | 5/2002 | Pitsch et al. ......... 398/158 |
| 2004/0037572 A1 * | 2/2004 | Matsuyama ........... 398/208 |
| 2004/0264976 A1 * | 12/2004 | Kim et al. ............ 398/155 |

FOREIGN PATENT DOCUMENTS

| JP | 6-188835 | 7/1994 |
| JP | 7-15327 | 1/1995 |
| JP | 7-153093 A | 6/1995 |
| JP | 7-193437 A | 7/1995 |
| JP | 9-200121 | 7/1997 |
| JP | 2002-353895 | 12/2002 |

(Continued)

OTHER PUBLICATIONS

English abstract of Japanese Application No. 6-188835.
English abstract of Japanese Application No. 7-15327.

(Continued)

*Primary Examiner* — Dalzid Singh
(74) *Attorney, Agent, or Firm* — Cantor Colburn LLP

(57) ABSTRACT

A photodiode receives an infrared signal transmitted from a transmitter. A current distributing unit outputs a detection current Id output from the photodiode as a first detection current Id1 and a second detection current Id2 to a subsequent first current-to-voltage conversion amplifier and a subsequent second current-to-voltage conversion amplifier respectively. The first and second current-to-voltage conversion amplifiers convert the detection currents into voltages with current-to-voltage conversion gains g1 and g2. The current-to-voltage conversion gains g1 and g2 of the first and second current-to-voltage conversion amplifiers are set such that ranges of signal levels in which the distributed detection currents Id1 and Id2 can significantly be amplified differ from each other.

21 Claims, 23 Drawing Sheets

FOREIGN PATENT DOCUMENTS

JP           2004-80701 A     3/2004

OTHER PUBLICATIONS

English abstract of Japanese Application No. 9-200121.
English abstract of Japanese Application No. 2002-353895.
International Search Report for International Application No. PCT/JP2005/017714 mailed Dec. 13, 2005.
International Preliminary Report on Patentability for International Application No. PCT/JP2005/017714 issued Apr. 3, 2007.
Notification of Reason(s) for Refusal for Patent Application No. 2006-537743 with English translation dispatched Jan. 25, 2011.
Notification of Reason(s) for Refusal for Japanese Application No. 2006-537743 dispatched Jul. 26, 2011 with English translation.

* cited by examiner

14'

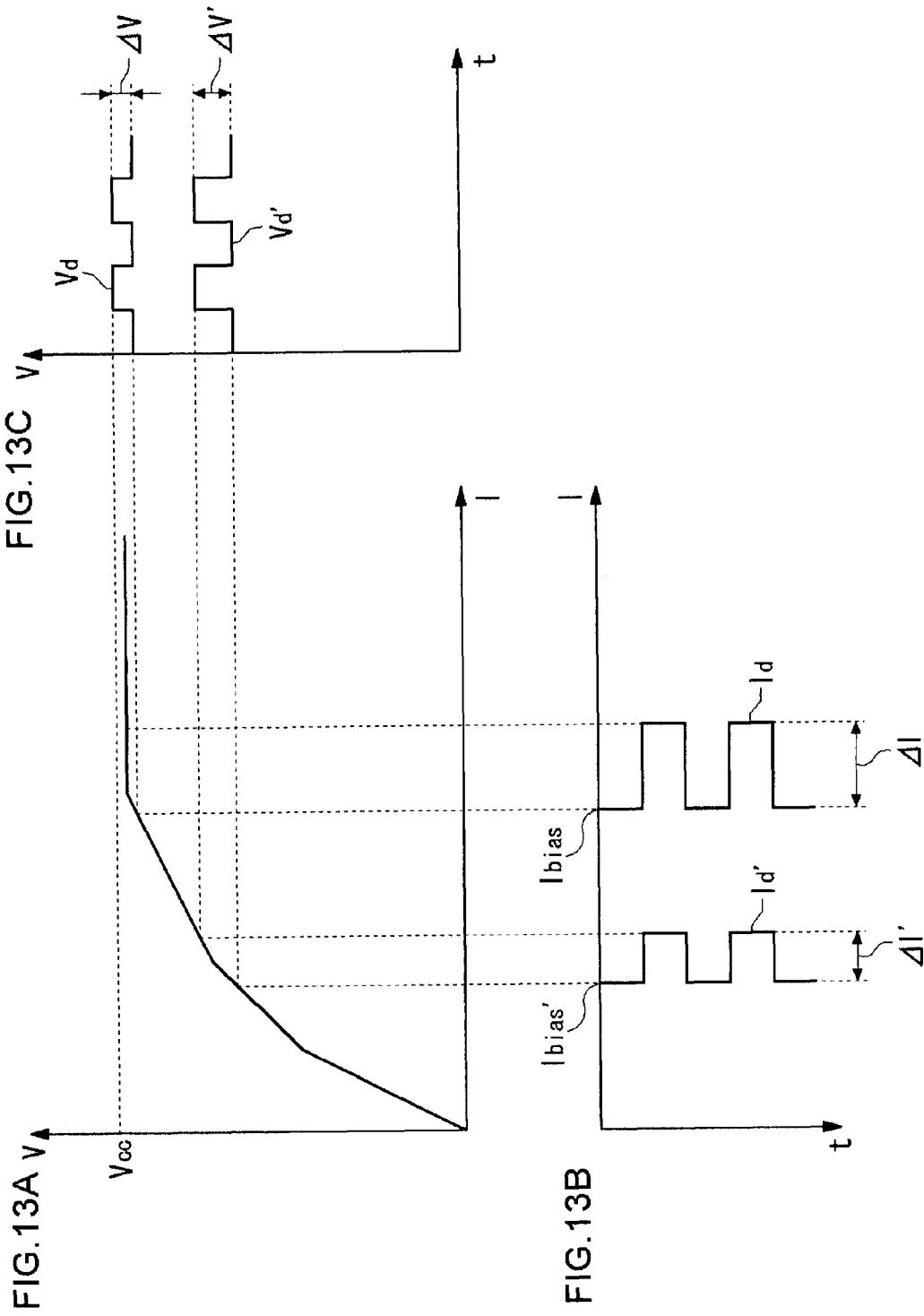

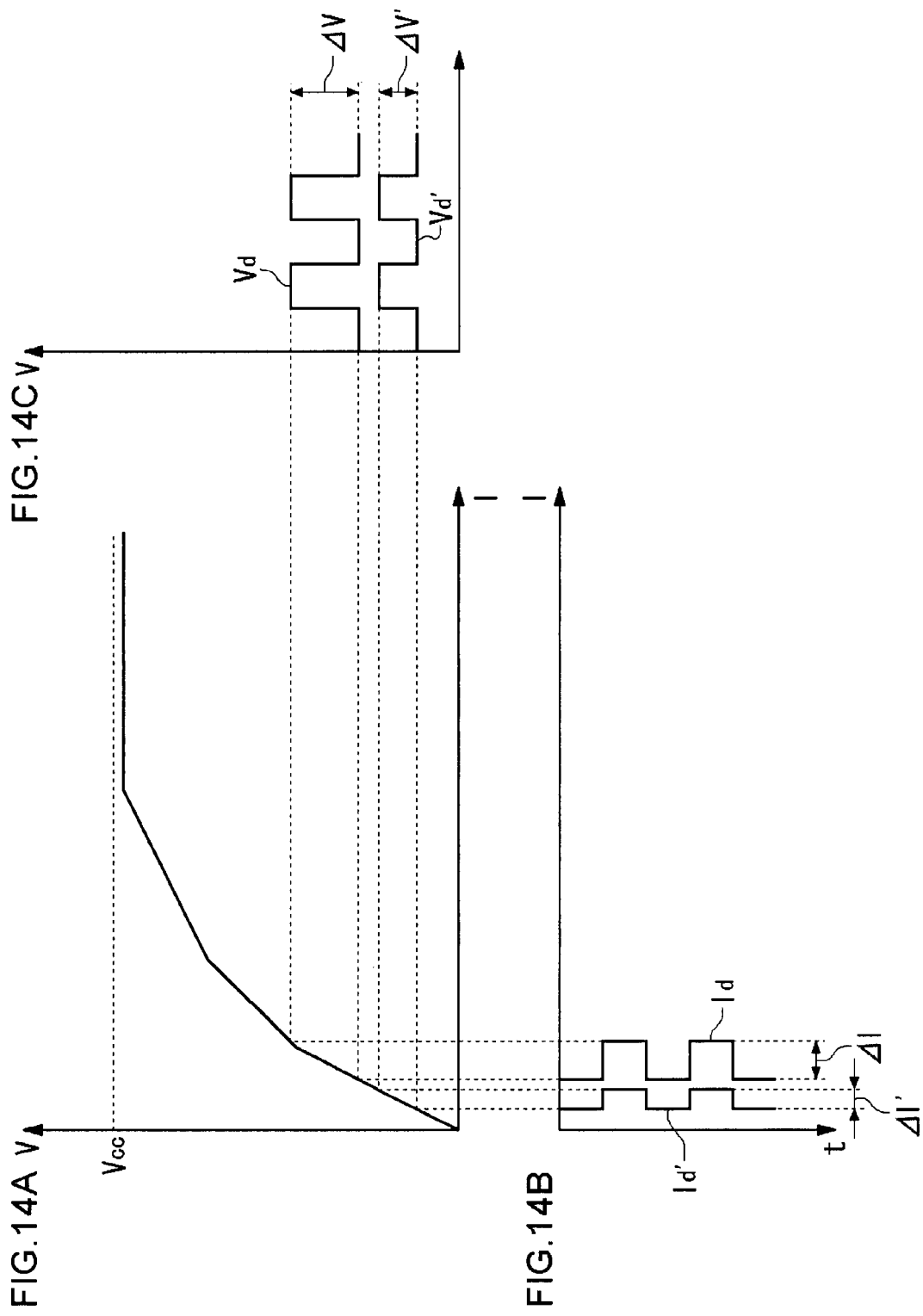

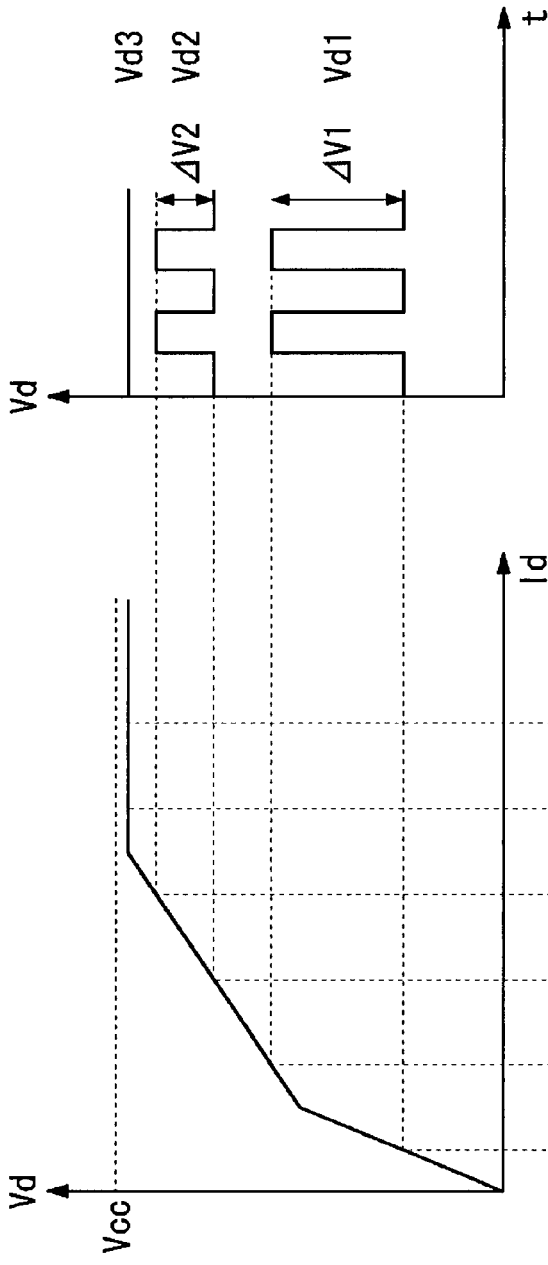

66, 68

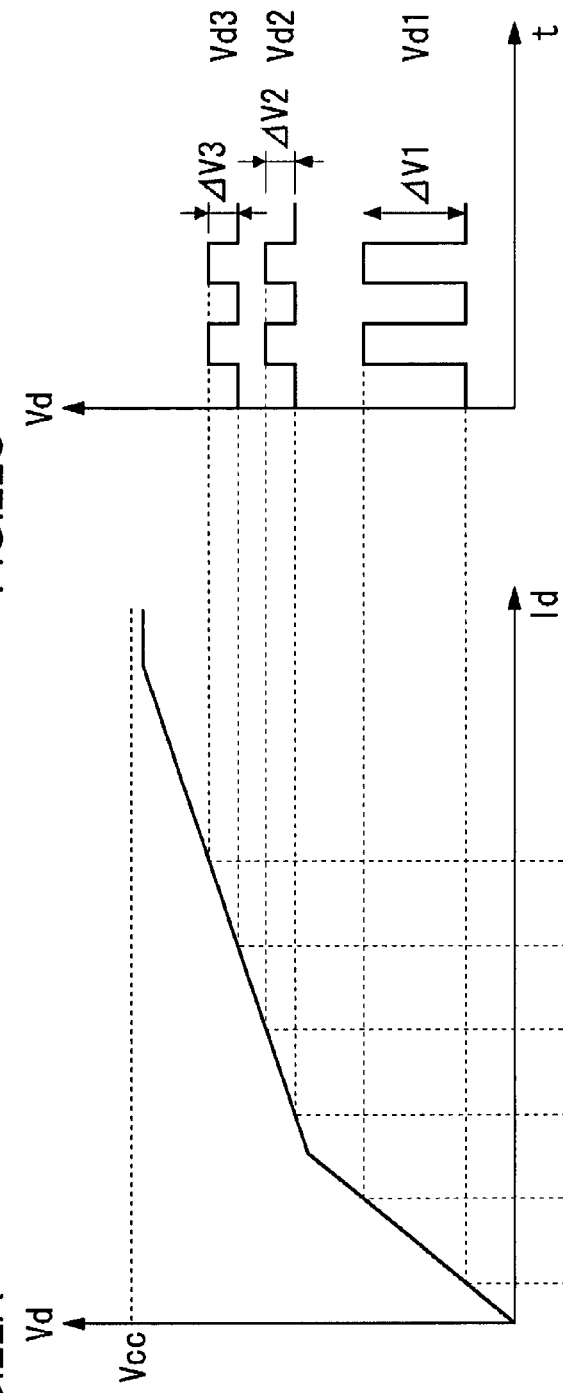
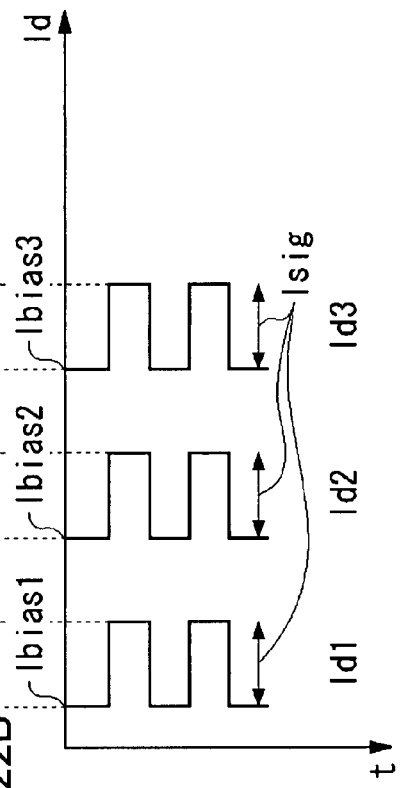

US 8,027,594 B2

RECEIVING APPARATUS AND ELECTRONIC DEVICE USING THE SAME

CROSS REFERENCE TO RELATED APPLICATIONS

This is a U.S. national stage of application No. PCT/JP2005/017714, filed on 27 Sep. 2005. Priority under 35 U.S.C. §119(a) and 35 U.S.C. §365(b) is claimed from Japanese Application No. 2004-282512, filed 28 Sep. 2004, Japanese Application No. 2004-295301, filed on 7 Oct. 2004 and Japanese Application No. 2005-113088, filed 11 Apr. 2005 the disclosure of which is also incorporated herein by reference.

FIELD OF THE INVENTION

The present invention relates to a receiver, and to a technique of ensuring sensitivity with a wide dynamic range.

DESCRIPTION OF THE RELATED ART

Recently, a remote controller in which an infrared ray is utilized is frequently used to perform remote control of various electronic equipments such as television and a camera. Such remote controllers are not always used in a room where a noise except for a signal component is small, but desirably the remote controllers can be used outdoors under the condition that various noises such as sunlight exist.

The remote controller includes a transmitter which transmits the infrared ray and a receiver which receives an infrared signal transmitted from the transmitter. The infrared signal is transmitted from the transmitter while modulated by a predetermined modulation method. The receiver includes a light receiver which receives the infrared signal. The light receiver detects the infrared ray with a light receiving element such as a photodiode to convert the infrared ray into an electric current, and the current is amplified to a sufficient signal level by an amplifier which performs current-to-voltage conversion, and signal processing such as demodulation is performed.

Usually, because electric power is supplied to the transmitter by a battery, the transmitted infrared signal level is not so large. On the other hand, sometimes the level of the disturbance noise such as the sunlight is tens thousand to millions times the level of the infrared signal. The infrared signal transmitted from the transmitter is an alternating current signal in which amplitude is changed by the modulation, and the disturbance noise is a direct-current signal in which the signal level is not temporally changed.

In the case where a current-to-voltage conversion gain of the amplifier is set such that good detection sensitivity is obtained under the condition of the low disturbance noise such as the sunlight, because the input of the sunlight saturates the gain of the amplifier to decrease the detection sensitivity, the signal component is hardly detected.

Therefore, it is necessary to increase the power supply voltage in order to ensure a dynamic range while the detection sensitivity is kept constant. However, this contradicts a demand for electric power saving. On the contrary, it is necessary to decrease the current-to-voltage conversion gain in order to widen the dynamic range while the power supply voltage is kept constant. However, the detection sensitivity is decreased when the disturbance noise such as the sunlight exists, which narrows an effective range of the remote controller.

In order to solve the above problem, conventionally the gain is compressed such that the current-to-voltage conversion gain is lowered as the detection current output from the photodiode is increased. For example, Patent Document 1 discloses a technique of providing an input matching circuit having a function which is proportional to a square root of output current of the photodiode.

[Patent Document 1] Japanese Patent Application Laid-Open No. 6-188835

However, even in the method of compressing the current-to-voltage conversion gain in the amplifier, the extremely large external noise such as the sunlight exists as a direct-current bias component, and the sufficiently high current-to-voltage conversion gain is hardly obtained in the range where the photodiode has the extremely large detection current, which narrows the usable range of the remote controller.

SUMMARY OF THE INVENTION

The present invention is made in view of the above problem, a general purpose of the invention is to provide a receiver in which the good detection sensitivity can be obtained with the wide dynamic range.

A first embodiment according to the invention relates to a receiver. The receiver includes a sensitive element which receives a signal from the outside to convert the signal into an electric signal and outputs the electric signal; a distributing unit which distributes the electric signal output from the sensitive element in a form of plural electric signals; plural amplifiers which amplify the plural electric signals distributed by the distributing unit with different gains; and an adder which adds the plural electric signals amplified by the plural amplifiers.

In the present specification, the "sensitive element" shall mean an element which can detect a physical signal such as light, magnetism, sound, and vibration to convert the physical signal into an electric signal. According to the embodiment of the invention, the amplifiers are caused to differ from one another in the amplification gain of the electric signal, and the dynamic range and detection sensitivity can freely be set in the receiver.

The gains of the plural amplifiers may be set such that the plural amplifiers differ from one another in a range of signal level in which the distributed electric signal can significantly be amplified.

The sensitive element may be a light receiving element which receives an optical signal to convert the optical signal into an electric signal and outputs the electric signal.

The light receiving element outputs a detection current according to an amount of light received in the form of the electric signal, the distributing unit distributes the detection current output from the light receiving element to the plural amplifiers in the form of the plural detection currents, the plural amplifiers converts the plural detection currents into plural detection voltages with different current-to-voltage conversion gains, and the adder may add the plural detection voltages.

Because the current according to the amount of light received flows through the light receiving element such as a photodiode and a phototransistor, the current is distributed into the plural amplifiers by the current mirror circuit or the like, which allows the suitable adjustment of the current values distributed into the amplifiers.

The adder may perform addition after direct-current components of the plural electric signals amplified by the plural amplifiers are removed.

The electric signals are added after the direct-current component included in the external noise is removed, which allows only the significant signal component to be extracted to perform the signal processing.

The direct-current component may be removed after the plural electric signals amplified by the plural amplifiers are added.

Another embodiment according to the invention also relates to a receiver. The receiver includes plural sensitive elements which receive signals from the outside to convert the signals into electric signals and output the electric signals; plural amplifiers which amplify the plural electric signals output from the plural sensitive elements; and an adder which adds the plural electric signals amplified by the plural amplifiers.

According to the embodiment of the invention, the levels of the signals input to the amplifiers are freely set by changing the number of sensitive elements and the sizes of the sensitive elements, and the gains of the amplifiers can be set according to the signal levels. Therefore, the good detection sensitivity can be obtained with the wide dynamic range.

Gains of the amplifiers may be set so as to be lowered as a level of the electric signal output from the sensitive element is increased.

In the case where the gain is compressed in the amplifier, the gain is increased as the level of the input electric signal is decreased. Therefore, the level of the electric signal per one sensitive element is lowered by providing the plural sensitive elements, which allows the good detection sensitivity to be obtained.

The sensitive element may be a light receiving element which receives an optical signal to convert the optical signal into the electric signal and outputs the electric signal.

Sizes of the plural sensitive elements may be set such that the level of the electric signal is included in a range where the amplifier which amplifies the electric signal has a significant gain, the electric signal being output when the maximum signal regarded as an input is input.

The amplifier can be adjusted to the signal level having the high gain by adjusting the size of the sensitive element such as the photodiode which outputs the electric signal according to the size, so that the detection sensitivity can be enhanced.

Gains of the plural amplifiers may be set such that the electric signal can significantly be amplified, the electric signal being output when the maximum signal regarded as an input is input to the sensitive element.

Instead of the size adjustment of the sensitive element, the detection sensitivity can be enhanced by adjusting the gain of the amplifier.

The plural light receiving element output plural detection currents according to an amount of light received in a form of the electric signal, the plural amplifiers convert the plural detection currents into plural detection voltages, and the adder may add the plural detection voltages.

The adder may perform addition after direct-current components of the plural electric signals amplified by the plural amplifiers are removed.

The electric signals are added after the direct-current component included in the external noise is removed, which allows only the significant signal component to be extracted to perform the signal processing.

The direct-current component may be removed after the plural electric signals amplified by the plural amplifiers are added.

Still another embodiment according to the invention also relates to a receiver. The receiver includes a sensitive element which receives a signal from the outside to convert the signal into an electric signal and outputs the electric signal; an amplifier which amplifies the electric signal output from the sensitive element; a distributing unit which distributes the electric signal amplified by the amplifier into plural paths; and an adder which adds the plural electric signals distributed by the distributing unit.

The adder may perform addition after direct-current components of the plural electric signals are removed. The plural paths may include DC blocking capacitors.

The electric signals are added after the direct-current component included in the external noise is removed. Therefore, only the significant signal component can be added while the external noise mixed as the direct-current component is removed.

A gain of the amplifier may be set so as to be lowered as a level of the electric signal output from the sensitive element is increased. The dynamic range can be expanded by performing the gain compression in the amplifier.

The plural paths may include buffer circuits respectively. The voltage can stably be added by performing impedance conversion with the buffer circuit.

The adder may include a differential amplifier having plural differential pairs; a load which is commonly provided for the plural differential pairs; plural current sources which supply bias currents to the plural differential pairs respectively. The adder may input the plural electric signals distributed by the distributing unit, to the plural differential pairs respectively.

The plural electric signals are input to the plural differential pairs, and the current flowing through each differential pair flows through the common load, which allows the plural electric signals to be added.

The sensitive element may be a light receiving element which receives an optical signal to convert the optical signal into an electric signal and outputs the electric signal. The light receiving element outputs a detection current according to an amount of light received in a form of the electric signal, the amplifier converts the detection current into a voltage and amplified the voltage, and the adder may add the voltages of the plural electric signals.

Because the photocurrent according to an amount of light received flows through the light receiving element such as the photodiode and the phototransistor, the photocurrent is current-to-voltage-converted and amplified by the amplifier, and the obtained voltage is distributed and added. Therefore, the dynamic range can be widened in the receiver.

The sensitive element, the amplifier, the distributing unit, and the adder may be integrated on one semiconductor integrated circuit. "Integrated" shall mean the case in which all the components constituting the circuit are formed on the semiconductor substrate and the case in which the main components constituting the circuit are integrally formed, and parts of the resistors and capacitors may be provided outside the semiconductor substrate in order to adjust a circuit constant. The sensitive element, the amplifier, the distributing unit, and the adder may separately be formed on the plural semiconductor substrates and incorporated into one package.

Still another embodiment according to the invention is an electronic equipment which is remotely controlled from the outside using an infrared signal. The electronic equipment includes the above receiver which receives a pulse-modulated infrared signal which is incident from the outside; a demodulation unit which demodulates the infrared signal received by the receiver; and a control unit which controls operation of the electronic equipment based on the infrared signal demodulated by the demodulation unit.

According to the embodiment of the invention, under the condition of the external noises having the different levels, the infrared signal can suitably be detected, and the electronic equipment can remotely and stably be controlled in various environments.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 13A to 13C are views showing a state of signal amplification in the current-to-voltage conversion amplifier shown in FIG. 10.

FIGS. 14A to 14C are views showing the state of the signal amplification in the current-to-voltage conversion amplifier shown in FIG. 10.

FIGS. 19A to 19C are views showing a state of signal amplification in the current-to-voltage conversion amplifier shown in FIG. 17.

FIGS. 22A to 22C are views showing a state of signal amplification in the current-to-voltage conversion amplifier shown in FIG. 17 when a gain is set low.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

A receiver according to a first embodiment of the invention is a light receiver which receives an infrared signal transmitted from a transmitter of an infrared remote controller, to perform signal processing such as demodulation.

Figure 1:
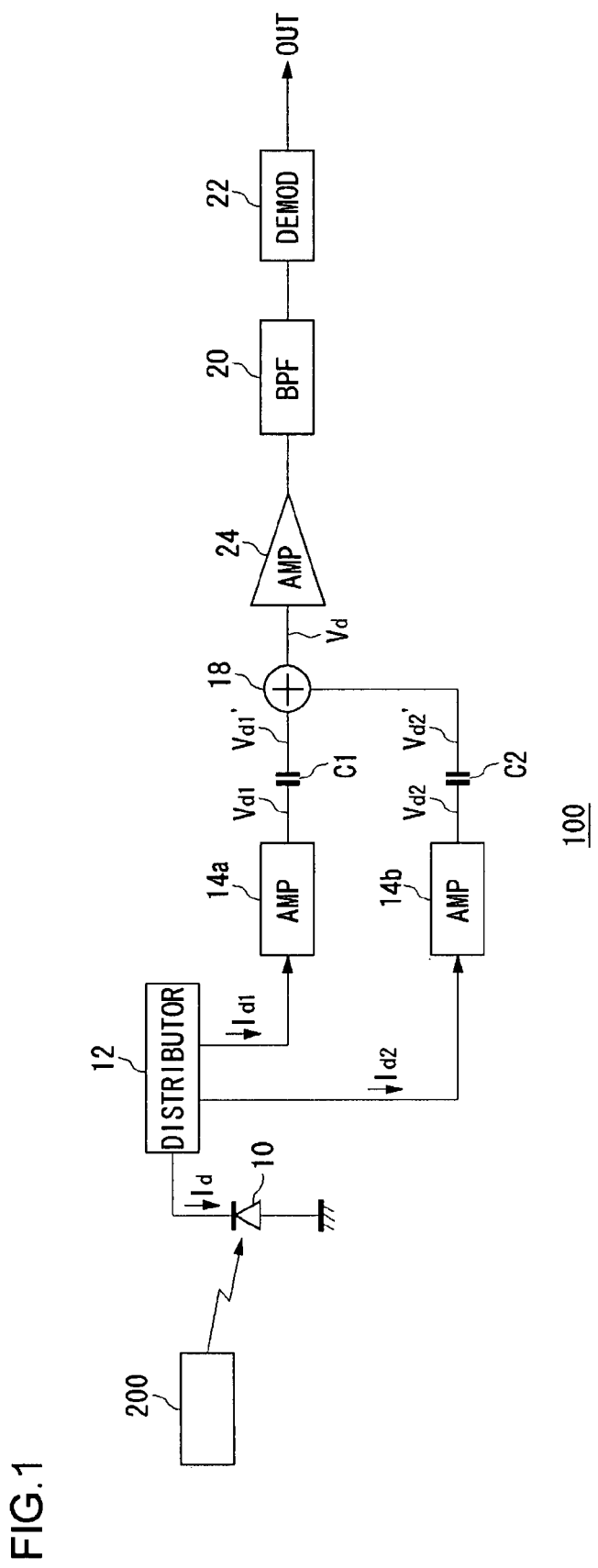
FIG. 1 is a circuit diagram showing a configuration of a light receiver according to a first embodiment.

FIG. 1 is a circuit diagram showing a configuration of a light receiver 100 of the embodiment. The light receiver 100 conducts communication with a transmitter 200 through an infrared ray. The transmitter 200 transmits the infrared signal to which modulation such as Pulse Position Modulation (PPM) is performed.

The light receiver 100 includes a photodiode 10 which is of light receiving element, a current distributing unit 12, a first current-to-voltage conversion amplifier 14a, a second current-to-voltage conversion amplifier 14b, a first DC blocking capacitor C1, a second DC blocking capacitor C2, an adder 18, a bandpass filter 20, a demodulator 22, and an amplifier 24.

The photodiode 10 receives the infrared signal transmitted from the transmitter 200. The photodiode 10 outputs a current according to an amount of light received of the infrared signal as a detection current Id. As used herein, outputting the current shall mean that a photocurrent flowing through the photodiode 10 due to incidence of the infrared signal is extracted to the outside in the form of a signal, and outputting the current shall include both the case where the photocurrent flowing through the photodiode 10 is drawn from an external circuit and the case where the photocurrent flowing through the photodiode 10 is taken out to the external circuit.

The detection current Id output from the photodiode 10 is input to the current distributing unit 12.

The current distributing unit 12 outputs the detection current Id output from the photodiode 10 as a first detection current Id1 and a second detection current Id2 to subsequent first current-to-voltage conversion amplifier 14a and second current-to-voltage conversion amplifier 14b respectively.

The first current-to-voltage conversion amplifier 14a performs current-to-voltage conversion of the first detection current Id1, and outputs the first detection voltage Vd1 according to the first detection current Id1. Similarly, the second current-to-voltage conversion amplifier 14b outputs the second detection voltage Vd2 according to the second detection current Id2.

For the first detection voltage Vd1 and second detection voltage Vd2 output respectively from the first current-to-voltage conversion amplifier 14a and second current-to-voltage conversion amplifier 14b, the first DC blocking capacitor C1 and the second DC blocking capacitor C2 removes direct-current components to output only alternating current components.

As described later, in current-to-voltage conversion gains g1 and g2 of the first current-to-voltage conversion amplifier 14a and second current-to-voltage conversion amplifier 14b, ranges of signal levels in which the detection currents Id1 and Id2 which are of the distributed electric signals can significantly be amplified are set so as to differ from each other.

A first detection voltage Vd1' and a second detection voltage Vd2' in which the direct-current components are removed are input to the adder 18. The adder 18 adds the first and second detection voltages Vd1' and Vd2' and outputs the addition result as a detection voltage Vd. The amplifier 24 amplifies the detection voltage Vd output from the adder 18 if needed.

In a frequency component of the detection voltage Vd, the bandpass filter 20 passes only a band near a carrier frequency while removing other bands. Then, the bandpass filter 20 outputs the detection voltage Vd to the demodulator 22. The demodulator 22 demodulates the pulse-position-modulated signal to perform waveform shaping, and the demodulator 22 outputs the signal to a signal processing unit (not shown).

Figure 2:
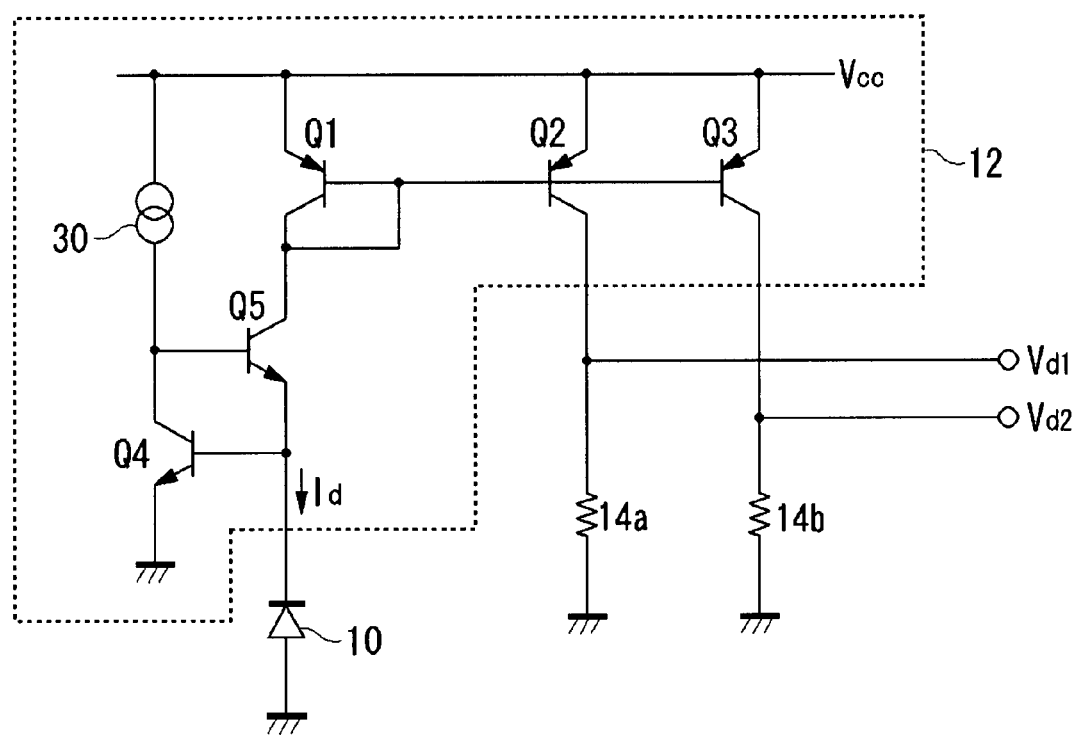
FIG. 2 is a circuit diagram showing a configuration of a current distributing unit, a first current-to-voltage conversion amplifier, and a second current-to-voltage conversion amplifier of FIG. 1.

FIG. 2 is a circuit diagram showing a configuration of the current distributing unit 12, the first current-to-voltage conversion amplifier 14a, and the second current-to-voltage conversion amplifier 14b.

The current distributing unit 12 includes first to fifth transistors Q1 to Q5 and a constant current source 30.

The fourth transistor Q4 and the fifth transistor Q5 are formed by an NPN type bipolar transistor, and constitute a bias circuit with the constant current source 30.

The first to third transistors Q1 to Q3 are formed by a PNP type bipolar transistor, base terminals thereof are commonly connected, and emitter terminals thereof are connected to a power supply voltage Vcc. The first to third transistors Q1 to Q3 constitute a current mirror circuit. The photodiode 10 is connected to a collector terminal of the first transistor Q1 through the fifth transistor Q5, and the photocurrent which flows when the photodiode 10 receives the infrared ray flows through the first transistor Q1 as the detection current Id.

As described above, the first to third transistors Q1 to Q3 constitute the current mirror circuit, and the first detection current Id1 and second detection current Id2 which are proportional to a size ratio to the first transistor Q1 are flowing through the second transistor Q2 and third transistor Q3 respectively. In the embodiment, it is assumed that all the size ratios of the transistor are set to 1:1:1. The detection current Id is directly distributed as the first detection current Id1 and the second detection current Id2. That is, the relationship of Id=Id1=Id2 holds.

The first current-to-voltage conversion amplifier 14a and the second current-to-voltage conversion amplifier 14b include a first resistor R1 and a second resistor R2 respectively. In the first current-to-voltage conversion amplifier 14a, the first detection current Id1 flows through the first resistor R1 to generate voltage drop. The first current-to-voltage conversion amplifier 14a outputs the voltage drop (Id1×R1) across the first resistor R1 as the first detection voltage Vd1.

Similarly, in the second current-to-voltage conversion amplifier 14b, the second detection current Id2 flows through the second resistor R2 to generate voltage drop. The second current-to-voltage conversion amplifier 14b outputs the voltage drop as the second detection voltage Vd2. In the embodiment, it is assumed that R1>R2 holds between resistance values of the first resistor R1 and second resistor R2.

Figure 3A:
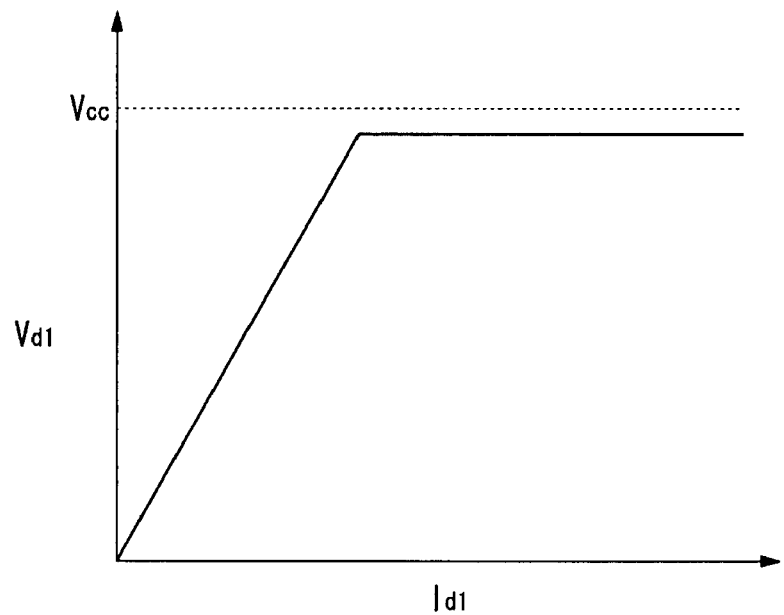
FIGS. 3A and 3B are views showing input/output properties of the first and second current-to-voltage conversion amplifiers of FIG. 2 respectively.
Figure 3B:
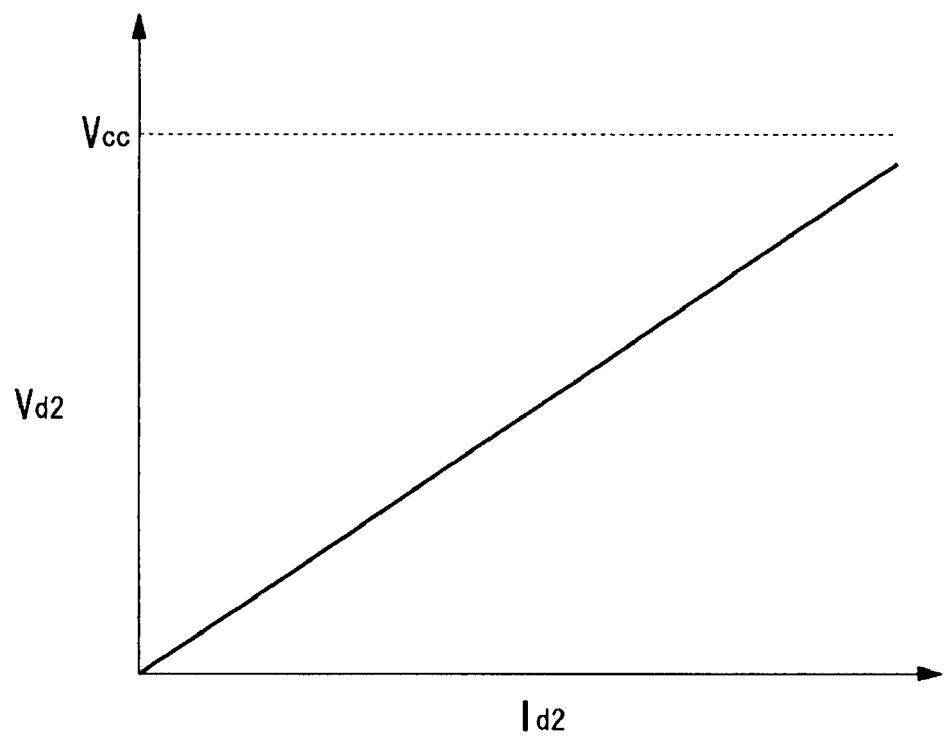

FIGS. 3A and 3B are views showing input/output properties of the first and second current-to-voltage conversion amplifiers 14a and 14b respectively. As shown in FIG. 3A, in the first current-to-voltage conversion amplifier 14a, as the first detection current Id1 is increased, the first detection voltage Vd1 is also increased in accordance with the relationship of Vd1=R1×Id1. However, because the emitter voltages of the first to third transistors Q1 to Q3 in the current distributing unit 12 are fixed to the power supply voltage Vcc, as the detection voltage Vd1 which is of the collector voltage is increased, the voltage between collector and emitter is decreased, and the bipolar transistor enters a saturation region. As a result, the current distributing unit 12 is not operated as the current mirror circuit, and the first detection voltage Vd1 is saturated before reaching the power supply voltage Vcc.

On the other hand, in the second current-to-voltage conversion amplifier 14b, because the resistance value of the second resistor R2 is set lower than that of the first resistor R1, the input/output property has a small inclination as shown in FIG. 3B, and the second detection voltage Vd2 is not saturated even if the second detection current Id2 is increased.

At this point, when a current-to-voltage conversion gain g of the current-to-voltage conversion amplifier is defined by g=ΔVd/ΔId using a change amount ΔVd of the output detection voltage for a change amount ΔId of the input detection current, a current-to-voltage conversion gain g1 in the first current-to-voltage conversion amplifier 14a is given by the resistance value of the first resistor R1, and a current-to-voltage conversion gain g2 in the second current-to-voltage conversion amplifier 14b is given by the resistance value of the second resistor R2. That is, in the case where the current-to-voltage conversion amplifier is formed by the resistor, the current-to-voltage conversion gain g is equalized to the resistance value of the resistor.

Figure 4:
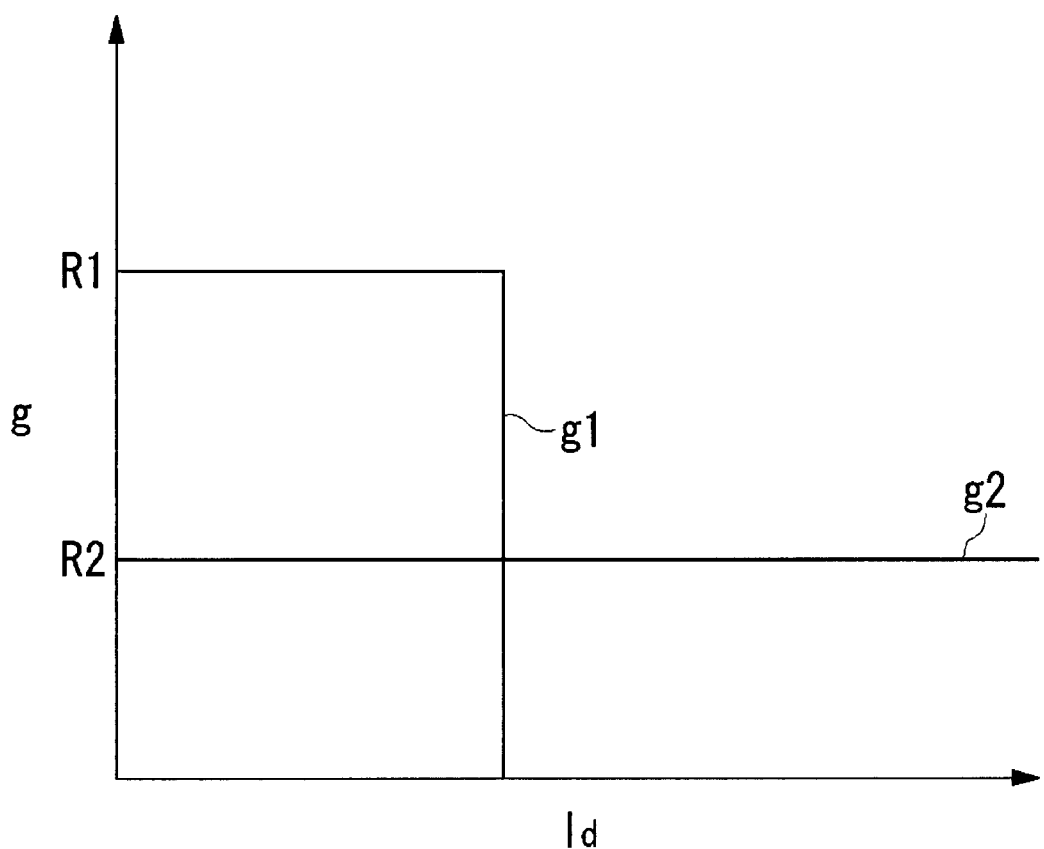
FIG. 4 is a view showing current-to-voltage conversion gains of the first and second current-to-voltage conversion amplifiers of FIG. 2.

FIG. 4 is a view showing the current-to-voltage conversion gains g1 and g2 of the first and second current-to-voltage conversion amplifiers 14a and 14b. In the first current-to-voltage conversion amplifier 14a, g1=R1 holds in the region of Vcc>Vd1. When Vd1 is increased to reach Vcc, g1=0 is obtained because Vd1 is kept constant. In the second current-to-voltage conversion amplifier 14b, because the second resistor R2 has the low resistance value, g2=R2 holds over the detection current region Id2.

Thus, the current-to-voltage conversion gains g1 and g2 of the first and second current-to-voltage conversion amplifiers 14a and 14b are set such that the ranges of the signal levels in which the detection currents Id1 and Id2 which are of the distributed electric signals can significantly be amplified differ from each other.

An operation of the light receiver 100 having the above configuration will be described.

Figure 5:
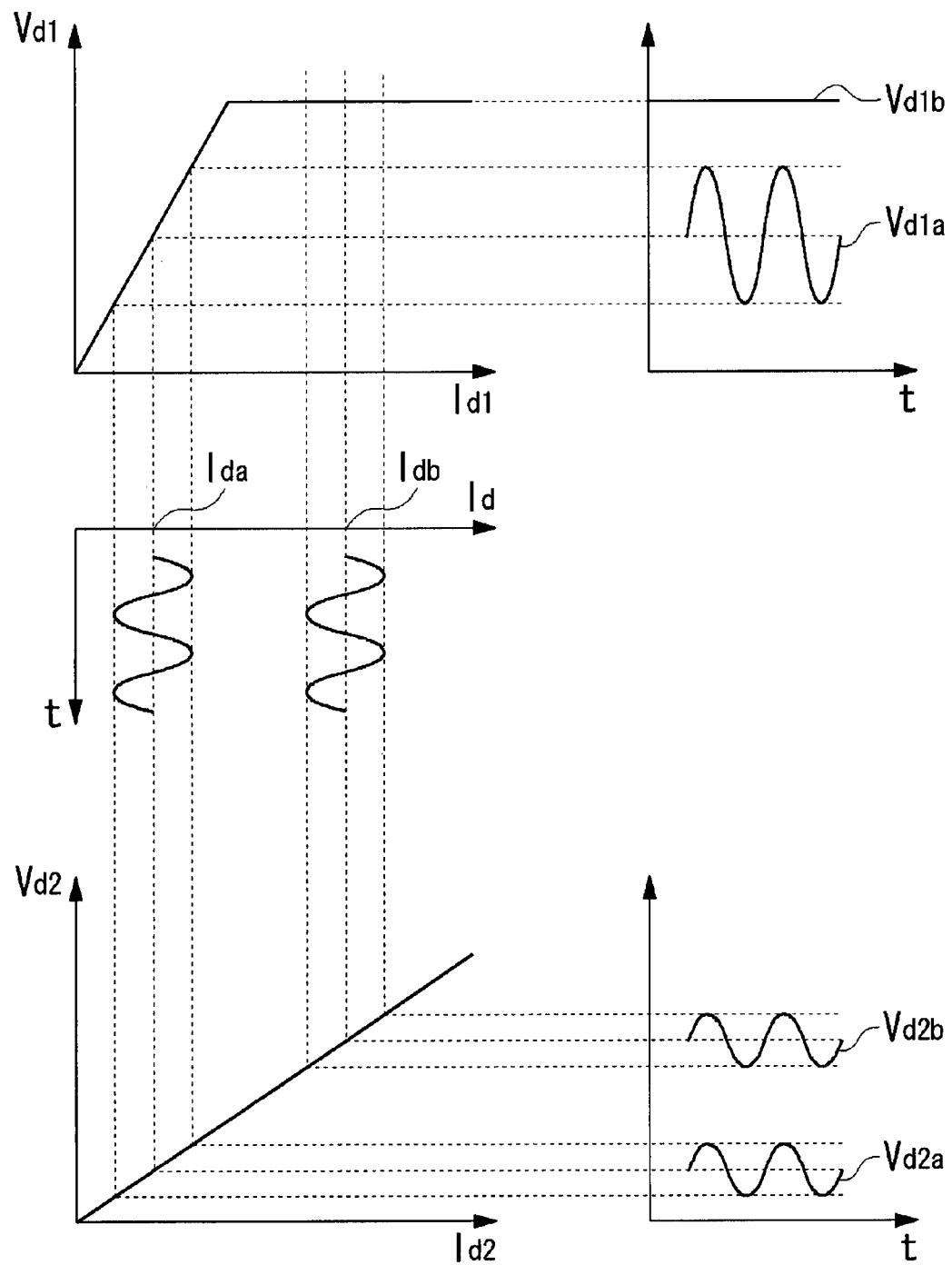
FIG. 5 is a view showing a relationship between current and voltage in each unit of the light receiver of FIG. 1.

FIG. 5 is a view showing a relationship between the current and the voltage in each unit of the light receiver 100. An upper column and a lower column of FIG. 5 show the input/output properties of the first current-to-voltage conversion amplifier 14a and the second current-to-voltage conversion amplifier 14b. A middle column of FIG. 5 shows a time waveform of the detection current Id when the infrared signals having the same amplitude are incident under different disturbance noise levels. Although the actual time waveform of the detection current Id has a shape corresponding to the pulse position modulation signal, the time waveform is shown as a simple sine waveform in FIG. 5 for simplification.

The optical signal incident to the photodiode 10 becomes the sum of the infrared signal radiated from the transmitter 200 and a disturbance noise such as sunlight. Usually it is believed that the disturbance noise such as the sunlight is a direct-current signal whose value is temporally kept constant. Accordingly, as shown in the middle column of FIG. 5, the detection current Id to which the photodiode 10 performs the current conversion becomes a signal to which a direct-current bias component is added to the infrared signal. In the following description, it is assumed that Ida is a direct-current bias component of the detection current in the case of the small disturbance noise while Idb is a direct-current bias component of the detection current in the case of the large disturbance noise.

First, the operation in which the signal is amplified by the one current-to-voltage conversion amplifier while the current is not distributed by the current distributing unit 12 will be described in order to clarify the effect of the embodiment.

It is assumed that the voltage conversion of the detection current Id is performed only by the first current-to-voltage conversion amplifier 14a. When the direct-current bias current is given by Ida because the disturbance noise has the small level, the first detection voltage Vd1a is output with the sufficient amplitude as shown in FIG. 5. However, when the direct-current bias component is given by Idb because the disturbance noise level is increased, the first current-to-voltage conversion amplifier 14a is saturated as shown in FIG. 4. Therefore, the current-to-voltage conversion gain g1=0 is obtained, and the first detection voltage Vd1b becomes constant as shown in FIG. 5. Because the first detection voltage Vd1b includes no longer the modulation component of the infrared signal radiated from the transmitter 200, the subsequent demodulator 22 cannot demodulate the first detection voltage Vd1b. When the current-to-voltage conversion gain is ensured even if the disturbance noise has the large level, it is necessary that the power supply voltage Vcc be increased such that the current-to-voltage conversion property shown in FIG. 3A is extended into a higher detection current region, which contradicts the demand for lowering the power supply voltage.

On the contrary, in the case where the voltage conversion of the detection current Id is performed only by the second current-to-voltage conversion amplifier 14b whose current-to-voltage conversion gain is set low, the following problem is generated. In the second current-to-voltage conversion amplifier 14b, as shown in FIG. 4, the voltage-to-current conversion gain does not become zero even in the high detection current region. Accordingly, the signal can be detected even if the direct-current bias current is Idb because the disturbance noise has the large level as shown in FIG. 5. However, in the case where the current-to-voltage conversion gain is set low, the demodulation cannot be performed unless the amplitude of the detection current Id is increased to some extent, which results in the problem that the transmitter 200 cannot be used while separated far away from the light receiver 100.

Thus, in the conventional technique, when the signal is amplified only by the one current-to-voltage conversion amplifier, it is difficult to satisfy the two properties of the dynamic range and the detection sensitivity which have the trade-off relationship with each other.

The operation of the light receiver 100 of the embodiment will be described in the case where the current distributing unit 12 and the two current-to-voltage conversion amplifiers are used.

When the direct-current bias component of the detection current is given by Ida because the disturbance noise has the small level, as shown in FIG. 5, the time waveforms of the first detection voltage Vd1 and second detection voltage Vd2 are given by Vd1a and Vd2a respectively.

Figure 6A:
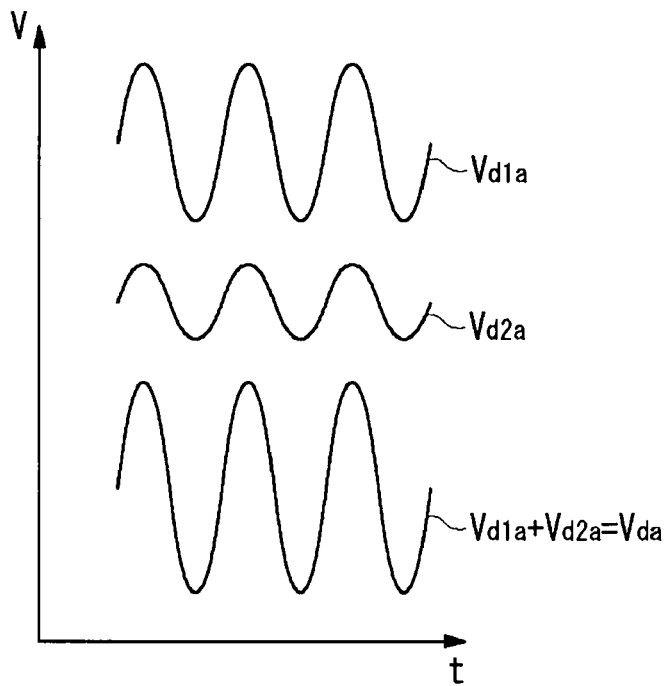
FIGS. 6A and 6B are views showing waveforms of input/output voltage in an adder of FIG. 1.
Figure 6B:
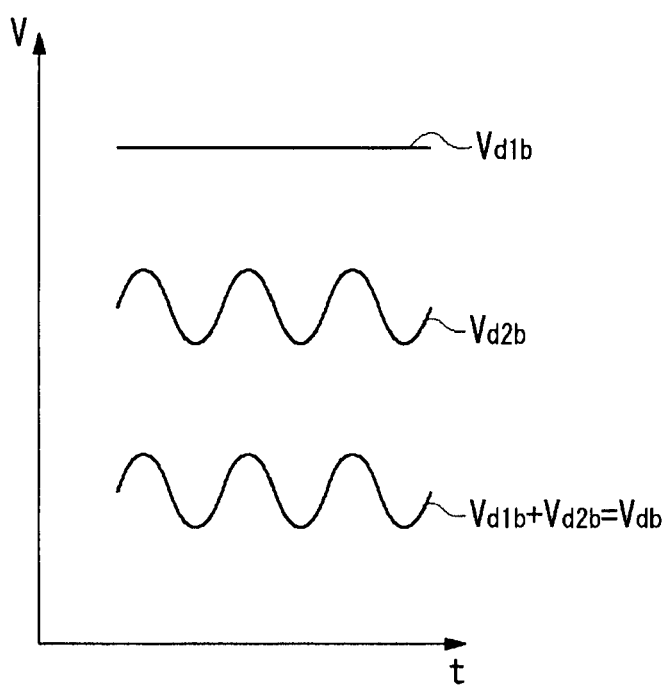

FIGS. 6A and 6B show waveforms of input/output voltage in the adder 18. As shown in FIG. 6A, the first detection voltage Vd1a and the second detection voltage Vd2a are added by the adder 18, and the detection voltage Vda is obtained. Even if the amount of light received of the infrared signal is decrease to lower the amplitude of the detection current Id because the transmitter 200 is separated far away from the light receiver 100, the amplification is performed with the high gain by the first current-to-voltage conversion amplifier 14a in the small external noise region, which allows the demodulation to be performed.

Then, the case of the large disturbance noise level will be described. At this point, the direct-current bias component Idb is added to the detection current Id in the photodiode 10. When the detection current Id is increased, because the first current-to-voltage conversion amplifier 14a is saturated as shown in FIG. 4, the current-to-voltage conversion gain g1=0 is obtained, and the first detection voltage Vd1b becomes constant as shown in FIG. 5.

On the other hand, the current-to-voltage conversion gain g2 of the second current-to-voltage conversion amplifier 14b is kept constant as shown in FIG. 4 even if the detection current level is increased. As a result, as shown in FIG. 5, the second detection voltage Vd2b can be obtained as the signal of the amplified detection current Id.

As a result, as shown in FIG. 6B, the detection voltage Vd obtained by adding the first detection voltage Vd1b and the second detection voltage Vd2b with the adder 18 has the time waveform corresponding to the infrared signal incident to the photodiode 10, so that the signal can be demodulated even under the condition that the large disturbance noise such as the sunlight exists.

Thus, in the embodiment, in the region where the detection current Id has the small level, the detection current Id is amplified with the high gain using the first current-to-voltage conversion amplifier 14a, which allows the reachable distance of the remote controller to be extended.

On the other hand, the current-to-voltage conversion gain g2 of the second current-to-voltage conversion amplifier 14b is set low to obtain the wide dynamic range, allowing the amplification of the infrared signal transmitted from the transmitter 200, even if the disturbance noise such as the sunlight which is much larger than the infrared signal exists.

That is, in the embodiment, the balance can be achieved between the two properties of the dynamic range and the detection sensitivity without increasing the power supply voltage Vcc or without performing the feedback control such that the gain of the current-to-voltage conversion amplifier is changed according to the amount of light received, although it has been difficult to achieve the balance in the conventional technique in which the signal is amplified by the one current-to-voltage conversion amplifier.

The embodiment is described only by way of example, and it is understood for those skilled in the art that various modifications can be made by combinations of components and processes, the modification will be within scope of the invention.

For example, in the embodiment, the first current-to-voltage conversion amplifier 14a is formed by the first resistor R1, and the input/output property is given in the form of the straight line as shown in FIG. 3A. Alternatively, the first current-to-voltage conversion amplifier 14a may be formed as shown in FIG. 7.

Figure 7:
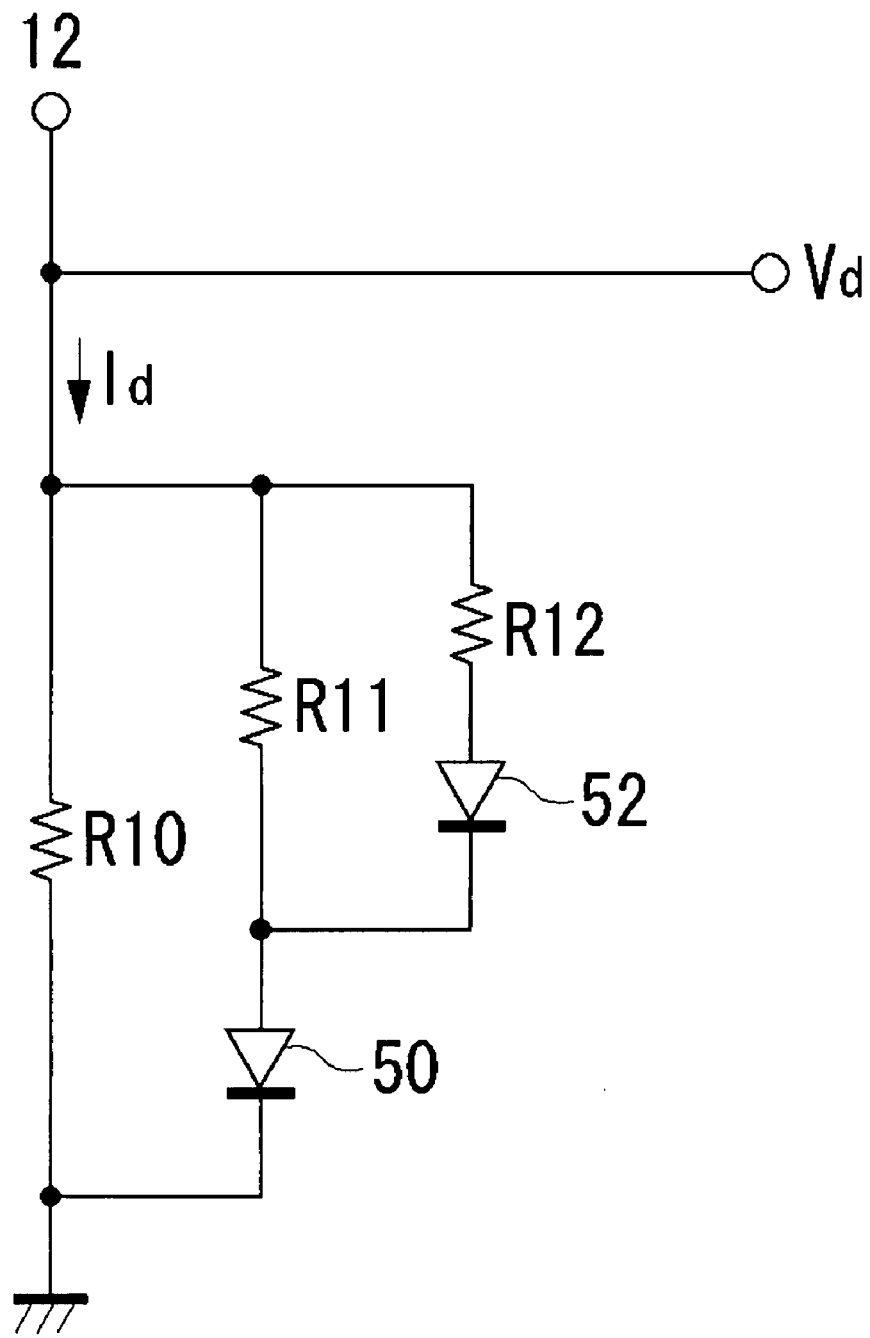
FIG. 7 is a circuit diagram showing a modification of the current-to-voltage conversion amplifier of FIG. 2.

FIG. 7 is a circuit diagram showing a modification of the current-to-voltage conversion amplifier. A current-to-voltage conversion amplifier 14' of FIG. 14 includes resistors R10 to R12 and diodes 50 and 52. In the region where the detection current Id is small, the diode 50 is not turned on because the small voltage is applied to the diode 50, but the current flows only through the resistor R10. The detection current Id is increased to increase the voltage drop across the resistor R10, and the voltage applied to the diode 50 exceeds the forward voltage Vf, which turns on the diode 50. This enables the current to flow through the diode 50 via the resistor R11. As a result, because the resistor R10 and the resistor R11 are connected in parallel, the gain in the current-to-voltage conversion amplifier 14' becomes small. When the detection current Id is increased to increase the voltage drop across the resistor R11, the diode 52 is turned on, which further decreases the composite resistance value which is obtained by the parallel connection among the resistors R10 to R12.

Figure 8:
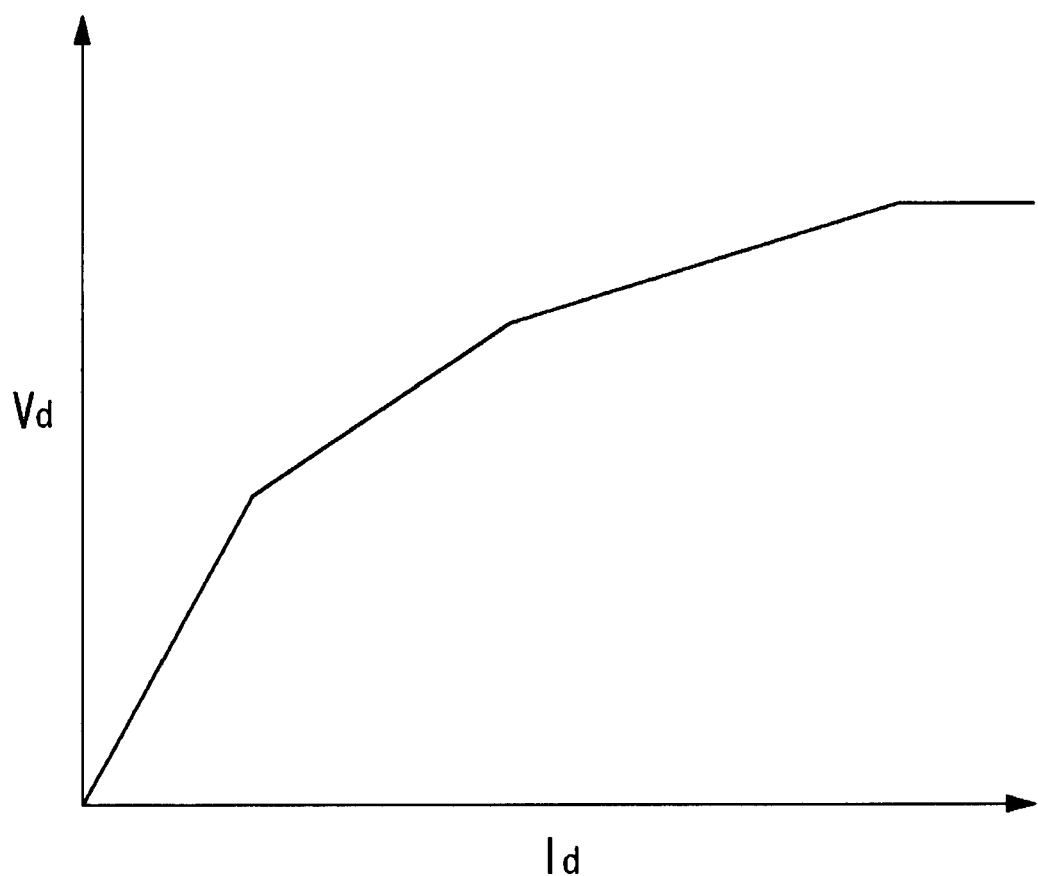
FIG. 8 is a view showing an input/output property of the current-to-voltage conversion amplifier shown in FIG. 7.

FIG. 8 shows the input/output property of the current-to-voltage conversion amplifier 14' shown in FIG. 7 having the above-described configuration. The detection current Id is increased, the resistance value is decreased in each time the diodes 50 and 52 are sequentially turned on, and the current-to-voltage conversion gain is decreased. Thus, in the embodiment, the gain may be compressed to widen the dynamic range in the current-to-voltage conversion amplifier.

In the embodiment, the current-to-voltage conversion gains g of the first and second current-to-voltage conversion amplifiers 14a and 14b are determined by the first resistor R1 and the second resistor R2 respectively. However, the invention is not limited thereto. For example, the current distribution ratio of the current distributing unit 12 is adjusted by changing the size ratio of the first to third transistors Q1 to Q3, and the current-to-voltage conversion gains g can be adjusted.

That is, it can also be perceived that the current distributing unit 12, the first current-to-voltage conversion amplifier 14a, and the second current-to-voltage conversion amplifier 14b perform the current-to-voltage conversion and the amplification as a whole. Accordingly, in the actual circuit configuration, the one circuit block can be configured to perform both the current distribution and the current-to-voltage conversion.

Although the two current-to-voltage conversion amplifiers are provided in the embodiment, at least three current-to-voltage conversion amplifiers may be provided to set the detailed range of the signal level which can significantly be amplified.

In the embodiment, a description is made by the light receiving element which receives the optical signal as an example. However, the invention is not limited thereto. The invention can widely be applied to the receivers, in which a magnetic sensitive element, which detects a magnetic signal, and the sensitive element such as a microphone and a piezoelectric element, which detects the vibration to convert the vibration into the electric signal, are used.

In the embodiment, as shown in FIG. 1, the first DC blocking capacitor C1 and the second DC blocking capacitor C2 are arranged immediately after the first current-to-voltage conversion amplifier 14a and the second current-to-voltage conversion amplifier 14b. Alternatively, the DC blocking capacitor may be arranged subsequent to the adder 18.

Second Embodiment

A receiver according to a second embodiment of the invention is a light receiver which receives the infrared signal transmitted from the transmitter of the infrared remote controller, to perform the signal processing such as the demodulation.

Figure 9:
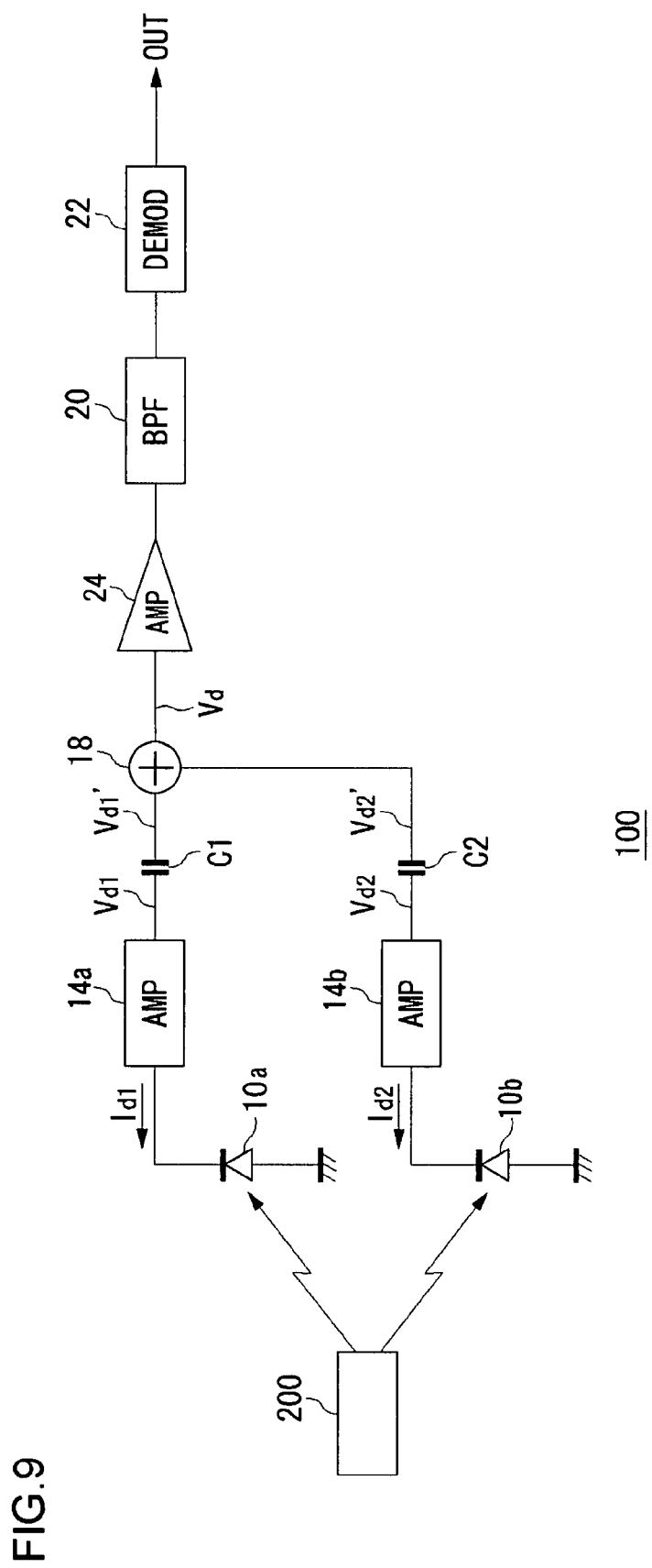
FIG. 9 is a circuit diagram showing a configuration of a light receiver according to a second embodiment.

FIG. 9 is a circuit diagram showing a configuration of the light receiver 100 of the embodiment. The light receiver 100 conducts the communication with the transmitter 200 through the infrared ray. The transmitter 200 transmits the infrared signal to which the modulation such as Pulse Position Modulation (PPM) is performed.

The light receiver 100 includes a first photodiode 10a, a second photodiode 10b which are of the light receiving elements, the first current-to-voltage conversion amplifier 14a, the second current-to-voltage conversion amplifier 14b, the first DC blocking capacitor C1, the second DC blocking capacitor C2, the adder 18, the bandpass filter 20, the demodulator 22, and the amplifier 24.

The first photodiode 10a and the second photodiode 10b receive the infrared signals transmitted from the transmitter 200 and output the currents according to the amount of light received of the infrared signals as first detection current Id1 and second detection current Id2. As used herein, outputting the current shall mean that a photocurrent flowing through the photodiode due to incidence of the infrared signal is extracted to the outside in the form of a signal, and outputting the current shall include both the case where the photocurrent flowing through the photodiode is drawn from an external circuit and the case where the photocurrent flowing through the photodiode is taken out to the external circuit.

The first detection current Id1 output from the photodiode 10a is input to the first current-to-voltage conversion amplifier 14a. Similarly, the second detection current Id2 output from the photodiode 10b is input to the second current-to-voltage conversion amplifier 14b.

The first current-to-voltage conversion amplifier 14a performs the current-to-voltage conversion of the first detection current Id1, and outputs the current in the form of the first detection voltage Vd1. Similarly, the second current-to-voltage conversion amplifier 14b outputs the second detection current Id2 in the form of the second detection voltage Vd2.

As described later, the current-to-voltage conversion gains of the first current-to-voltage conversion amplifier 14a and second current-to-voltage conversion amplifier 14b are set so as to be lowered as the levels of the electric signals output from the first photodiode 10a and second photodiode 10b are increased.

For the first detection voltage Vd1 and second detection voltage Vd2 output respectively from the first current-to-voltage conversion amplifier 14a and second current-to-voltage conversion amplifier 14b, the first DC blocking capacitor C1 and the second DC blocking capacitor C2 removes the direct-current components to output only the alternating current components.

The first detection voltage Vd1' and the second detection voltage Vd2' in which the direct-current components are removed are input to the adder 18. The adder 18 adds the first and second detection voltages Vd1' and Vd2' and outputs the addition result as the detection voltage Vd. The amplifier 24 amplifies the detection voltage Vd output from the adder 18 if needed.

In the frequency component of the detection voltage Vd, the bandpass filter 20 passes only the band near the carrier frequency while removing other bands, and the bandpass filter 20 outputs the detection voltage Vd to the demodulator 22. The demodulator 22 demodulates the pulse-position-modulated signal to perform the waveform shaping, and the demodulator 22 outputs the signal to the signal processing unit (not shown).

Figure 10:
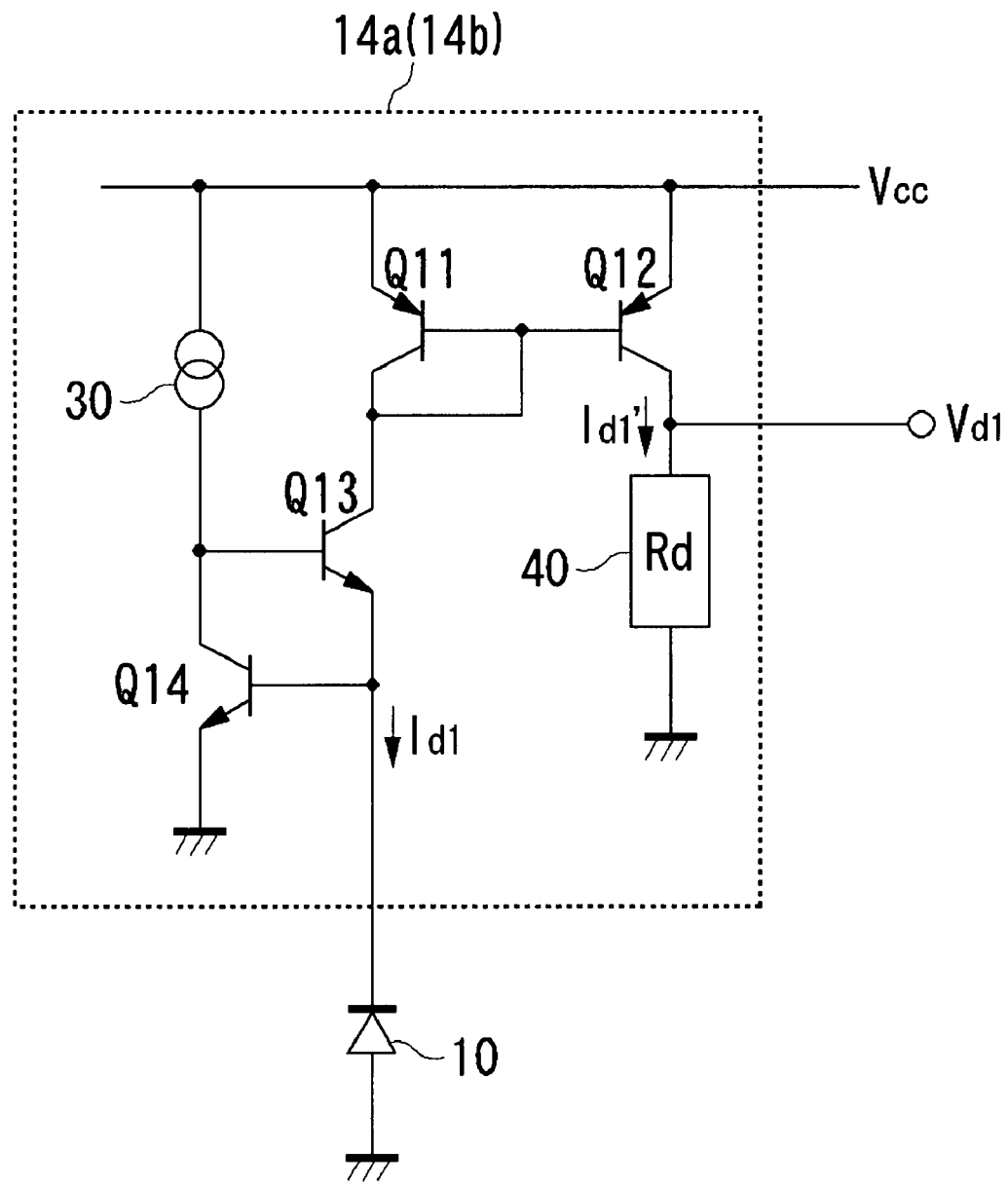
FIG. 10 is a circuit diagram showing a configuration of a first current-to-voltage conversion amplifier of FIG. 9.

FIG. 10 is a circuit diagram showing a configuration of the first current-to-voltage conversion amplifier 14a. The first current-to-voltage conversion amplifier 14a includes first to fourth transistors Q11 to Q14 and the constant current source 30. The third transistor Q13 and the fourth transistor Q14 are formed by an NPN type bipolar transistor, and constitute the bias circuit with the constant current source 30.

The first and second transistors Q11 and Q12 are formed by a PNP type bipolar transistor, the base terminals thereof are commonly connected, and the emitter terminals thereof are connected to a power supply voltage Vcc. The first and second transistors Q11 and Q12 constitute a current mirror circuit. The first photodiode 10*a* is connected to the collector terminal of the first transistor Q11 through the third transistor Q13, and the photocurrent which flows when the first photodiode 10*a* receives the infrared ray flows through the first transistor Q11 as the detection current Id1.

A resistor circuit 40 is connected to the collector terminal of the second transistor Q12. As described above, the first and second transistors Q11 and Q12 constitute the current mirror circuit, and the first detection current Id1' which is proportional to the size ratio to the first transistor Q11 flows through the second transistor Q12. In the embodiment, it is assumed that the size ratio of the first and second transistors Q11 and Q12 is set to 1:1, and it is also assumed that Id1'=Id1 holds.

A connection point between the collector terminal of the second transistor Q12 and the resistor circuit 40 constitutes the output terminal of the first current-to-voltage conversion amplifier 14*a*. When the detection current Id1 flows through the resistor circuit 40, the resistor circuit 40 generates the voltage drop (Id1×Rd) corresponding to a product of the detection current Id1 and the resistance value Rd of the resistor circuit 40. The current-to-voltage conversion can be performed by outputting the voltage drop as the detection voltage, and the first detection voltage Vd1=Id1×Rd is output from the output terminal.

In the first current-to-voltage conversion amplifier 14*a*, as the first detection current Id1 is increased, the first detection voltage Vd1 is also increased in accordance with the relationship of Id×Rd. However, because the emitter voltage of the second transistor Q12 is fixed to the power supply voltage Vcc, as the first detection voltage Vd1 which is of the collector voltage is increased, the voltage between collector and emitter is decreased, and the bipolar transistor enters the saturation region. As a result, the first and second transistors Q11 and Q12 are not operated as the current mirror circuit, and the first detection voltage Vd1 is saturated before reaching the power supply voltage Vcc. Thus, in the first current-to-voltage conversion amplifier 14*a*, the capability of the current-to-voltage conversion is restricted by the power supply voltage Vcc.

At this point, the current-to-voltage conversion gain g of the current-to-voltage conversion amplifier is defined by g=ΔVd/ΔId using the change amount ΔVd of the output detection voltage for the change amount ΔId of the input detection current. When the current-to-voltage conversion amplifier is formed by the resistor circuit, the current-to-voltage conversion gain g=ΔVd/ΔId is given by the resistance value Rd of the resistor circuit 40.

Figure 11:
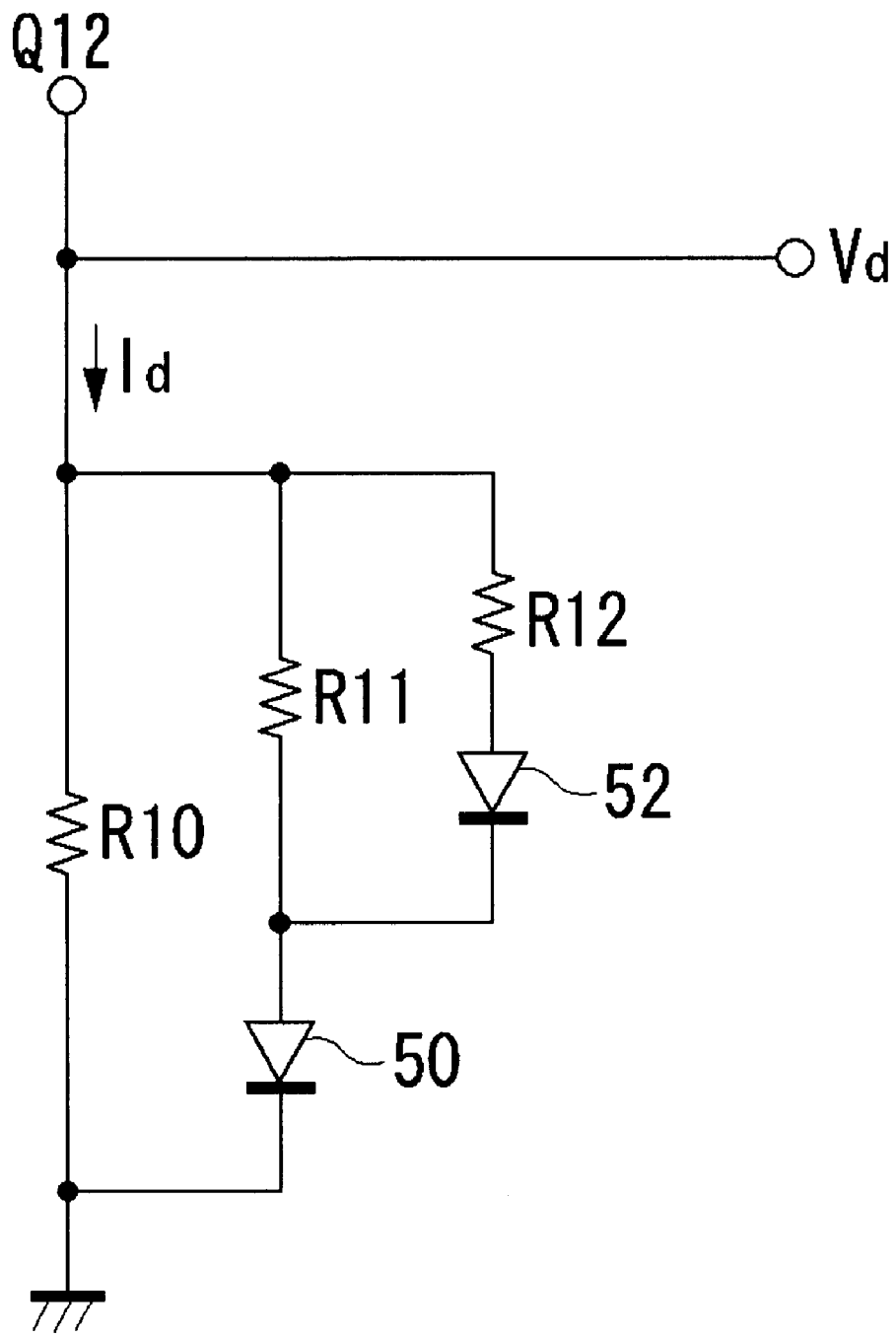
FIG. 11 is a circuit diagram showing a configuration of a resistor circuit of FIG. 10.

FIG. 11 is a circuit diagram showing a configuration of the resistor circuit 40 of FIG. 10. The resistor circuit 40 includes the resistors R10 to R12 and the diodes 50 and 52. In the region where the input current Id is small, the diode 50 is not turned on because the small voltage is applied to the diode 50, but the current flows only through the resistor R10. The input current Id is increased to increase the voltage drop across the resistor R10, and the voltage applied to the diode 50 exceeds the forward voltage Vf, which turns on the diode 50. This enables the current to flow through the diode 50 via the resistor R11. As a result, because the resistor R10 and the resistor R11 are connected in parallel, the resistance value Rd of the resistor circuit 40 is decreased.

When the input current Id is increased to increase the voltage drop across the resistor R11, the diode 52 is turned on, which connects the resistors R10 to R12 in parallel to further decrease the resistance value Rd of the resistor circuit 40.

When the input current Id is further increased to bring the detection voltage Vd close to the power supply voltage Vcc, because the detection voltage Vd is no longer increased, the current-to-voltage conversion gain becomes zero.

Figure 12A:
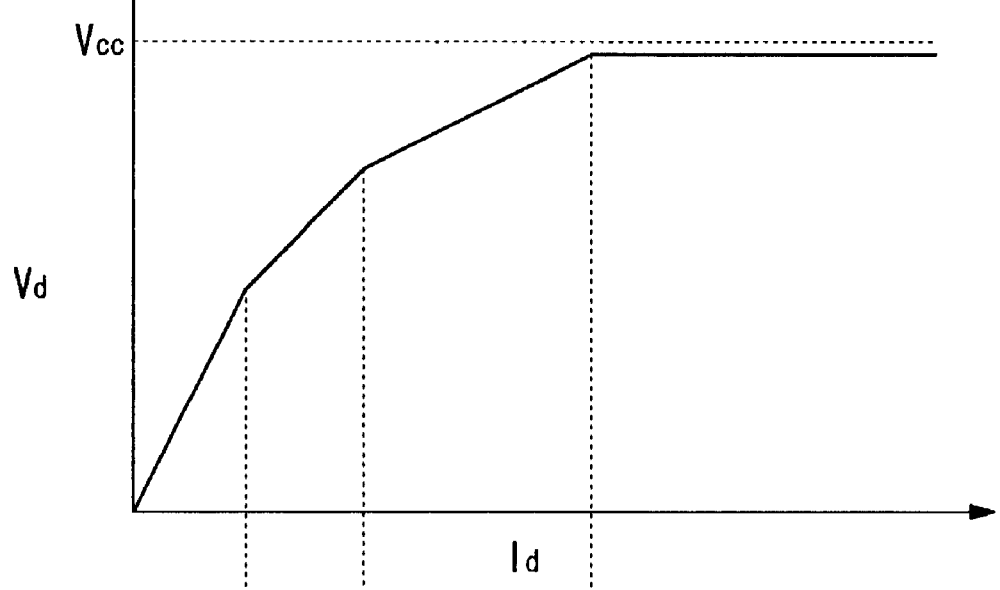
FIGS. 12A and 12B are views showing input/output properties and gains of the current-to-voltage conversion amplifier shown in FIG. 10.

FIG. 12A shows the input/output property of the current-to-voltage conversion amplifier 14*a* shown in FIG. 10. In FIG. 12A, a horizontal axis indicates the first detection current Id1 corresponding to the input, and a vertical axis indicates the first detection voltage Vd1 corresponding to the output. The gain of the first current-to-voltage conversion amplifier 14*a* shown in FIG. 12A is given in FIG. 12B.

The current-to-voltage conversion gain g of the current-to-voltage conversion amplifier is given by the resistance value Rd of the resistor circuit 40. Therefore, the gain is compressed when the resistor circuit 40 is formed as shown in FIG. 11. That is, in the current-to-voltage conversion amplifier, as shown in FIG. 12B, as the level of the detection current Id is increased, the gain is gradually decreased in the current-to-voltage conversion amplifier.

The gain is compressed in the current-to-voltage conversion amplifier, the detection current Id is amplified with the high gain when the detection current Id has the low level, and the detection current Id is amplified with the low gain when the detection current Id has the high level. Therefore, the dynamic range of the amplifiable detection current can be widened.

Figure 12B:
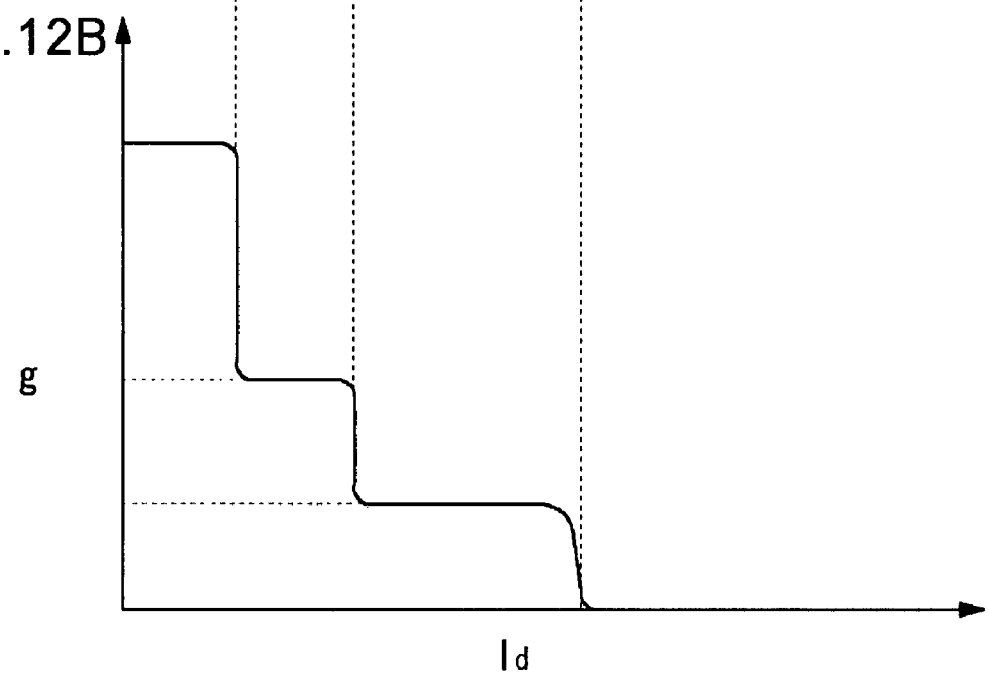

In the embodiment, it is assumed that the first current-to-voltage conversion amplifier 14*a* and second current-to-voltage conversion amplifier 14*b* have the input/output properties and gain properties shown in FIGS. 12A and 12B.

The operation of the light receiver 100 having the above configuration will be described. In the embodiment, because the first current-to-voltage conversion amplifier 14*a* and the second current-to-voltage conversion amplifier 14*b* have the similar configuration, the first current-to-voltage conversion amplifier 14*a* and the second current-to-voltage conversion amplifier 14*b* are not particularly distinguished from each other here. FIGS. 13A and 13B show the state of the signal amplification in the current-to-voltage conversion amplifier. FIG. 13A shows the input/output property of the current-to-voltage conversion amplifier. In FIG. 13A, the horizontal axis indicates the detection current Id corresponding to the input, and the vertical axis indicates the detection voltage Vd corresponding to the output.

FIG. 13B shows the time waveforms of the detection currents when the pulse-position-modulated infrared signal is input to the photodiode. The optical signal incident to the photodiode becomes the sum of the infrared signal radiated from the transmitter 200 and the disturbance noise such as the sunlight. Usually it is believed that the disturbance noise such as the sunlight is a direct-current signal whose value is temporally kept constant.

The detection current shown by Id in FIG. 13B indicates the time waveform when the high-level disturbance noise is incident to the photodiode having a light receiving area S which becomes a certain reference. The detection current Id has the waveform in which a direct-current bias component Ibias by the disturbance noise and the modulation component ΔI are added.

FIG. 13C shows the detection voltages output from the current-to-voltage conversion amplifier when the detection currents shown in FIG. 13B are input. The current-to-voltage conversion gain of the current-to-voltage conversion amplifier is set so as to be lowered as the level of the detection current which is of the input signal is increased. Therefore, when the unnecessary direct-current bias component is added by the disturbance noise, the current-to-voltage conversion amplifier outputs the small amplitude ΔV of the detection voltage Vd.

In the light receiver 100 of the embodiment, in inputting the upper-limit level signal regarded as the sum of the infrared signal and the disturbance noise, the light receiving area of the photodiode is set such that the detection current is included in the range where the current-to-voltage conversion amplifier has the significant gain. In other words, the light receiving area of the photodiode is set so as to output the detection current which does not saturate the gain of the current-to-voltage conversion amplifier, even if the high disturbance noise is incident. The detection current flowing through the photodiode is substantially proportional to the light receiving area, so that the detection current can be decreased to ½ by setting the light receiving area to ½.

The detection current Id' shown in FIG. 13B shows the time waveform when the light receiving area is set to S/2, the direct-current bias component by the disturbance noise becomes Ibias'=Ibias/2, and the detection current level is remarkably decreased. Thus, the light receiving area of the photodiode is reduced, which allows the detection current level to be decreased to the region where the current-to-voltage conversion amplifier has the high gain. Therefore, the detection current can be converted to the voltage with high gain. As a result, when the light receiving area of the photodiode is set to S/2, the modulation component ΔV' of the detection voltage output from the current-to-voltage conversion amplifier is increased to improve the reception sensitivity, when compared with the modulation component ΔV of the detection voltage in which the light receiving area is set to S.

When the light receiving area of the photodiode is set to ½, the modulation component of the infrared signal, that is, the amplitude ΔI also becomes ½. However, the current-to-voltage conversion gain becomes double or more, the modulation component ΔV' of the output detection voltage can be taken larger than the modulation component ΔV.

The light receiver 100 of the embodiment includes the two photodiodes having the sizes, in which the signal level of the detection current falls within the high-gain region of the current-to-voltage conversion amplifier under the condition that the level of the disturbance noise such as the sunlight becomes the maximum. When the first photodiode 10a and the second photodiode 10b are provided while brought close to each other, the modulation components ΔV' of the detection voltages output from the first current-to-voltage conversion amplifier 14a and the second current-to-voltage conversion amplifier 14b are substantially equal to each other. Therefore, the amplitude of the detection voltage Vd obtained by the addition with the adder 18 becomes double the ΔV', so that the detection sensitivity is further enhanced.

Thus, in the light receiver 100 of the embodiment, the infrared signal can be detected to widen the dynamic range under the condition of the large external noise.

The operation of the light receiver 100 in the case of the small external noise such as the sunlight will be described with reference to FIG. 14.

Similar to FIG. 13A, FIG. 14A shows the input/output property of the current-to-voltage conversion amplifier. In FIG. 14A, the horizontal axis indicates the detection current Id corresponding to the input, and a vertical axis indicates the detection voltage Vd corresponding to the output.

FIG. 14B shows the time waveforms of the detection currents when the pulse-position-modulated infrared signal is input with the small disturbance noise. The reference symbol Id designates the detection current output from the photodiode having the large light receiving area S, and the reference symbol Id' designates the detection current output from the photodiode having the small light receiving area S/2. Id'=Id/2 holds, because the detection current output from the photodiode is substantially proportional to the light receiving area.

FIG. 14C shows the time waveforms of the detection voltages which are of the outputs of the current-to-voltage conversion amplifier when the detection currents output from the photodiode having the different sizes are input. In the state where the disturbance noise has the small level like the inside of the room, even if the size is different in the photodiode, the level of the detection current input to the current-to-voltage conversion amplifier is not so changed, but the amplification is performed with the substantially same current-to-voltage conversion gain. When the modulation components of Id and Id' are compared to each other, ΔI'=ΔI/2 holds. As a result, when the detection currents Id and Id' are amplified by the same current-to-voltage conversion amplifier, as shown in FIG. 14C, ΔV>ΔV' holds in the modulation component of the detection voltage. Therefore, the diode having the small size is larger in the extent of the decrease in detection sensitivity.

That is, focusing only on the one photodiode, it means that the detection sensitivity is decreased under the condition that the disturbance noise has the low level when the size of the photodiode is set based on the condition that the disturbance noise such as the sunlight has the high level.

In the light receiver 100 of the embodiment, the detection currents output from the first photodiode 1a and second photodiode 10b are amplified by the first current-to-voltage conversion amplifier 14a and the second current-to-voltage conversion amplifier 14b, and the detection currents are added by the adder 18 after the direct-current components are removed.

Because the modulation component of the detection voltage Vd output from the adder 18 becomes substantially double the modulation component of the detection voltage output from the one current-to-voltage conversion amplifier, the modulation component which is decreased by reducing the size of the photodiode is apparently amplified. Therefore, the detection sensitivity is not worsened in the whole of the light receiver 100.

Thus, according to the light receiver 100 of the embodiment, the size of the photodiode is set such that the current-to-voltage conversion amplifier can perform the current-to-voltage conversion with the high gain even under the condition that the disturbance noise has the high level. As a result, in the case where the direct-current component such as the sunlight is input as the noise with the infrared signal transmitted from the transmitter 200, the signal can also be detected with the high detection sensitivity to widen the dynamic range.

For the decrease in detection sensitivity per photodiode caused by setting the photodiode to the small size, the plural photodiodes are provided in parallel, the detection currents output from the photodiodes are amplified and added, and thereby the decrease in detection sensitivity can be eliminated.

That is, in the embodiment, the balance can be achieved between the two properties of the dynamic range and the detection sensitivity without increasing the power supply voltage Vcc or without performing the feedback control such that the gain of the current-to-voltage conversion amplifier is changed according to the amount of light received.

In the light receiver 100 of the embodiment, the detection sensitivity and the dynamic range are improved without changing the power supply voltage Vcc. Alternatively, the low power supply voltage may be achieved while the detection sensitivity and the dynamic range are maintained.

In the current-to-voltage conversion amplifier shown in FIG. 10, for example, it is thought that power supply voltage Vcc is set to ½. At the same time, the resistance values of the resistors R10 to R12 are also set low in the resistor circuit 40 shown in FIG. 11.

Figure 15:
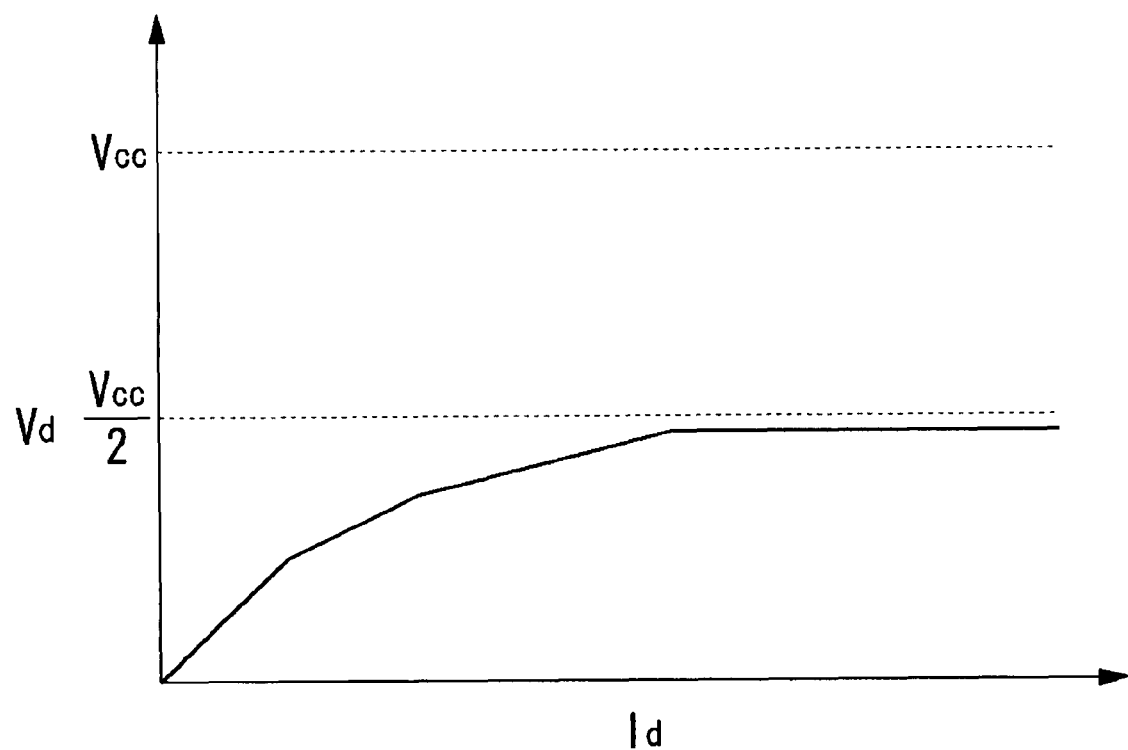
FIG. 15 is a view showing an input/output property of the current-to-voltage conversion amplifier shown in FIG. 10 when the low-voltage drive is achieved.

FIG. 15 shows the input/output property of the current-to-voltage conversion amplifier when the low-voltage drive is achieved. The gradient of the input/output property, i.e., the current-to-voltage conversion gain is decreased by setting the resistors R10 to R12 to the low resistance values.

In the case where the current-to-voltage conversion amplifier having the above design is used, the current-to-voltage conversion gain is decreased to about ½ of the current-to-voltage conversion gain shown in FIG. 12. However, because the light receiver 100 of the embodiment includes the two photodiodes and the two current-to-voltage conversion amplifiers, the amplitude of the detection voltage Vd output from the adder 18 is doubled, even if the current-to-voltage conversion gain is decreased to ½. Therefore, the same dynamic range and detection sensitivity can be substantially obtained compared with the case where the amplification is performed by the current-to-voltage conversion amplifier in which the single photodiode is driven by the power supply voltage Vcc is amplitude.

Thus, according to the light receiver 100 of the embodiment, the low-voltage drive can be achieved without decreasing the dynamic range and detection sensitivity.

The second embodiment is described only by way of example, and it is understood for those skilled in the art that various modifications can be made by combinations of components and processes, the modification will be within the scope of the invention.

In the embodiment, even in the large external noise, the current-to-voltage conversion amplifier performs the amplification with the high gain by reducing the light receiving area of the photodiode. However, because the magnitude of the detection current which is of the input of the current-to-voltage conversion amplifier and the dynamic range of the current-to-voltage conversion amplifier are relative, the input/output property of the current-to-voltage conversion amplifier may be adjusted while the size of the photodiode is fixed. That is, in the case where the size of the photodiode is previously fixed, the input/output property of the current-to-voltage conversion amplifier may be set so as to have the significant gain when the predetermined maximum signal is input to the photodiode.

Although the two photodiodes and the two current-to-voltage conversion amplifiers are provided in the embodiment, at least three photodiodes and current-to-voltage conversion amplifiers may be provided to set the detailed range of the signal level which can significantly be amplified.

In the embodiment, as shown in FIG. 9, the first DC blocking capacitor C1 and the second DC blocking capacitor C2 are arranged immediately after the first current-to-voltage conversion amplifier 14a and the second current-to-voltage conversion amplifier 14b. Alternatively, the DC blocking capacitor may be arranged subsequent to the adder 18.

Third Embodiment

A receiver according to a third embodiment of the invention is a light receiver which receives the infrared signal transmitted from the transmitter of the infrared remote controller, to perform the signal processing such as the demodulation. The light receiver is mounted on electronic equipments such as a television receiver and DSC (Digital Steal Camera) in order that the remote control can be performed by the infrared signal transmitted from the transmitter.

Figure 16:
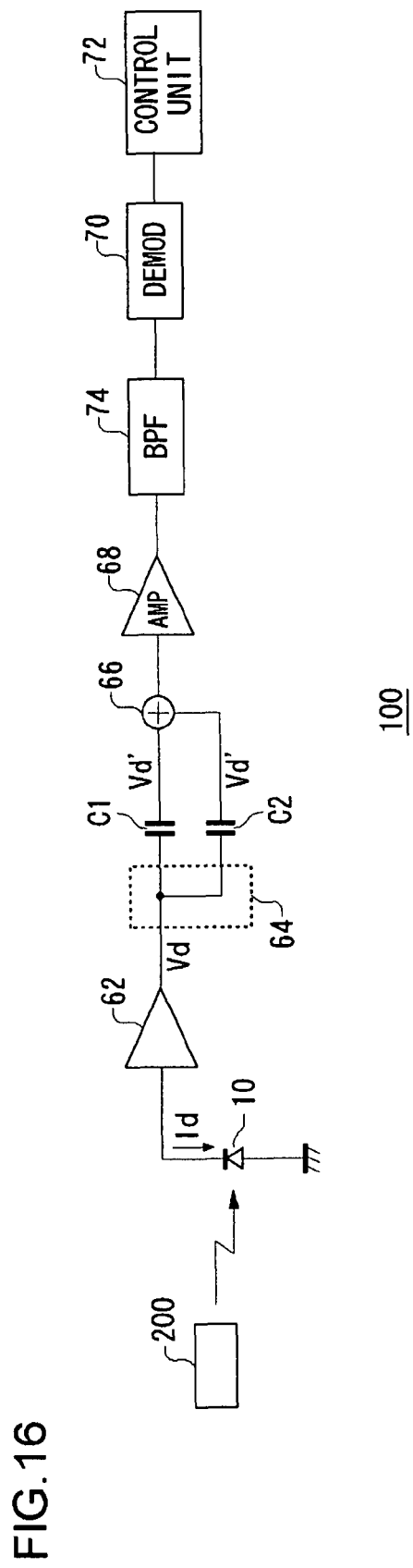
FIG. 16 is a circuit diagram showing a configuration of a light receiver according to a third embodiment.

FIG. 16 is a circuit diagram showing a configuration of the light receiver 100 of the third embodiment. The light receiver 100 conducts the communication with the transmitter 200 through the infrared ray. The transmitter 200 transmits the infrared signal to which the modulation such as Pulse Position Modulation (PPM) is performed.

The light receiver 100 includes the photodiode 10 which is of the light receiving element, a current-to-voltage conversion amplifier 62, a distributing unit 64, the first DC blocking capacitor C1, the second DC blocking capacitor C2, an adder 66, an amplifier 68, a demodulator 70, a control unit 72, and a bandpass filter 74.

The first photodiode 10 receives the infrared signal transmitted from the transmitter 200. The photodiode 10 outputs the current according to the amount of light received of the infrared signal as the detection current Id. As used herein, outputting the current shall mean that a photocurrent flowing through the photodiode 10 due to incidence of the infrared signal is extracted to the outside in the form of a signal, and outputting the current shall include both the case where the photocurrent flowing through the photodiode 10 is drawn from an external circuit and the case where the photocurrent flowing through the photodiode 10 is taken out to the external circuit.

The detection current Id output from the photodiode 10 is input to the current-to-voltage conversion amplifier 62. The current-to-voltage conversion amplifier 62 performs current-to-voltage conversion of the detection current Id which is of the electric signal output from the photodiode 10, performs the amplification, and outputs the electric signal as the detection voltage Vd.

Figure 17:
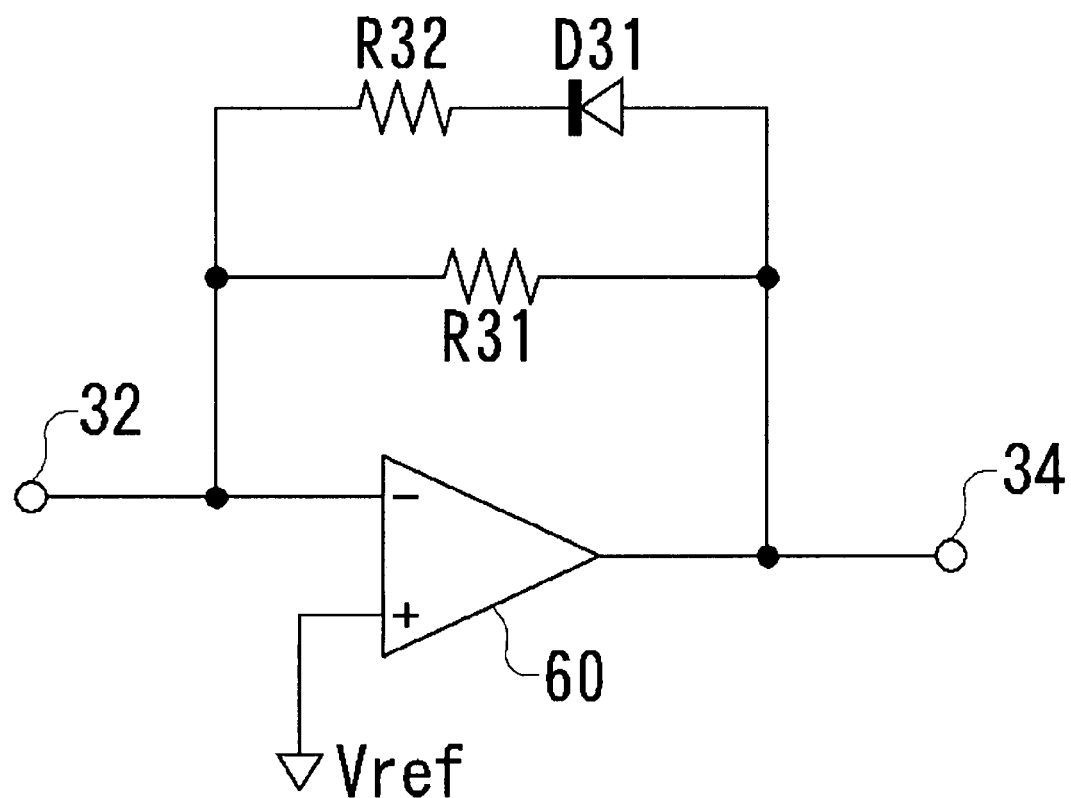
FIG. 17 is a circuit diagram showing a configuration example of a current-to-voltage conversion amplifier of FIG. 16.

FIG. 17 is a circuit diagram showing a configuration example of the current-to-voltage conversion amplifier 62. The current-to-voltage conversion amplifier 62 includes an operational amplifier 60, a first resistor R31, a second resistor R32 and a diode D31. The current-to-voltage conversion amplifier 62 converts the detection current Id input to an input terminal 32 into the voltage, amplifies the voltage, and outputs the voltage from an output terminal 34.

A reference voltage Vref is input to a non-inverting input terminal of the operational amplifier 60. The first resistor R31 is provided on a first feedback path between an output terminal and an inverting input terminal of the operational amplifier 60. The second resistor R32 and the diode D31 are connected in series on a second feedback path provided in parallel with the first resistor R31.

At this point, the current-to-voltage conversion gain g of the current-to-voltage conversion amplifier 62 is defined by g=$\Delta$Vd/$\Delta$Id using the change amount $\Delta$Vd of the detection voltage Vd for the change amount $\Delta$Id of the detection current Id. When a potential difference between the input terminal 32 and the output terminal 34 is smaller than the forward voltage Vf of the diode D31, the current flows only through the first feedback path, and the gain of the current-to-voltage conversion amplifier 62 is determined by the first resistor R31. When the potential difference between the input terminal 32 and the output terminal 34 is larger than the forward voltage Vf of the diode D31, the diode D31 is turned on and the current flows also through the second feedback path. Therefore, the feedback resistance value of the current-to-voltage conversion amplifier 62 becomes the composite resistor of the parallel connection between the first resistor R31 and the second resistor R32, and the gain of the current-to-voltage conversion amplifier 62 is determined by the composite resistor.

Figure 18A:
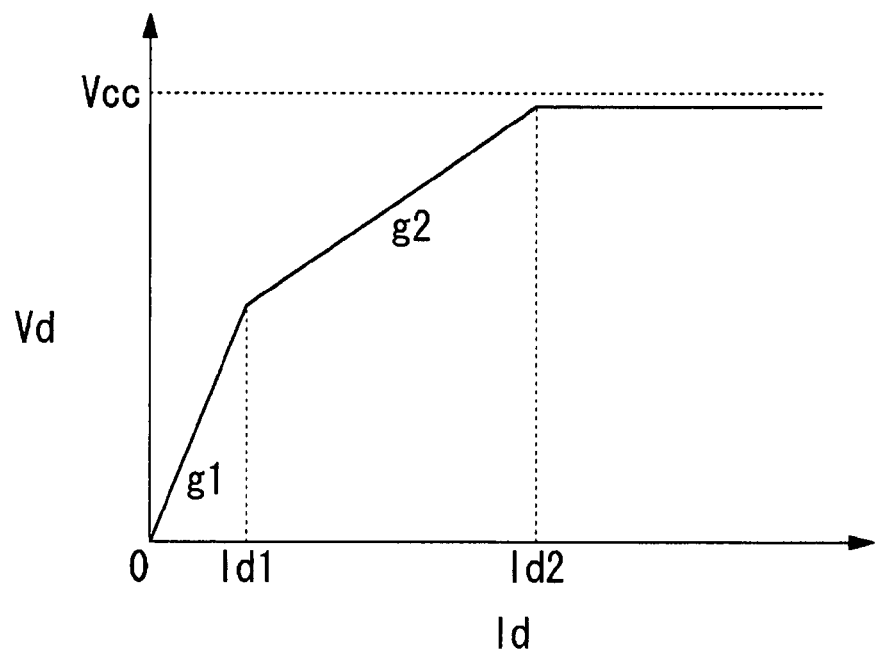
FIGS. 18A and 18B are views showing input/output properties and gain properties of the current-to-voltage conversion amplifier shown in FIG. 17.
Figure 18B:
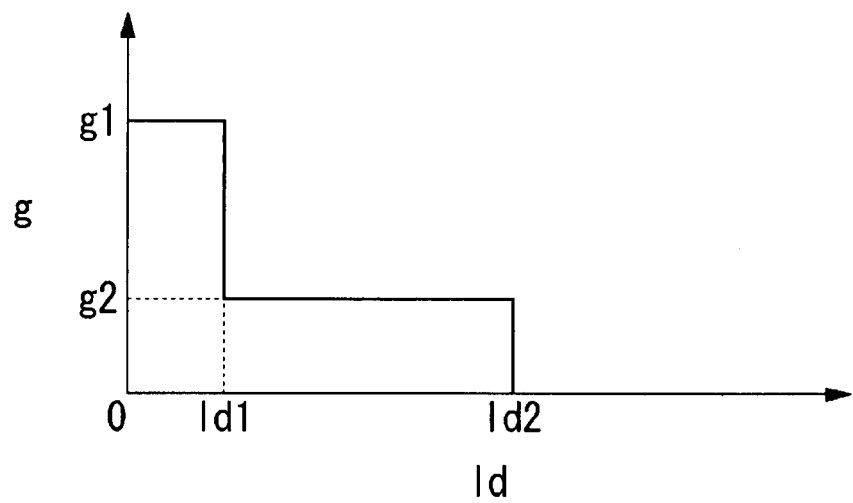

FIGS. 18A and 18B are views showing the input/output properties and gain properties of the current-to-voltage conversion amplifier 62. The current-to-voltage conversion amplifier 62 has the high gain g1 in an interval between 0 and Id1 of the detection current Id, and has the low gain in an interval between Id1 and Id2 of the detection current Id. When the detection voltage Vd is increased to the neighborhood of the power supply voltage Vcc, the gain becomes zero. Thus, the gain of the current-to-voltage conversion amplifier 62 is decreased as the level of the detection current Id output from the photodiode 10 is increased.

FIGS. 19A to 19C show the state of the signal amplification in the current-to-voltage conversion amplifier 62. FIG. 19A shows the input/output property of the current-to-voltage conversion amplifier 62. In FIG. 19A, the horizontal axis indicates the detection current Id corresponding to the input, and the vertical axis indicates the detection voltage Vd corresponding to the output.

FIG. 19B shows the time waveform of the detection current Id when the pulse-position-modulated infrared signal is input to the photodiode 10. The optical signal incident to the photodiode 10 becomes the sum of the infrared signal radiated from the transmitter 200 and the disturbance noise such as the sunlight. Usually it is believed that the disturbance noise such as the sunlight is a direct-current signal whose value is temporally kept constant.

FIG. 19B shows the time waveforms of the detection current Id when the disturbance noise whose amplitude has the level different from the infrared signal is incident to the photodiode 10 in addition to the infrared signal having the constant amplitude. The detection current Id has the waveform in which the direct-current bias component Ibias by the disturbance noise and a modulation component Isig are added. In the figure, the reference symbols Id1 to Id3 designate the time waveforms of the detection current Id under the different external noises.

FIG. 19C shows the detection voltages Vd output from the current-to-voltage conversion amplifier 62 when the detection currents Id1 to Id3 shown in FIG. 19B are input. Because the current-to-voltage conversion gain of the current-to-voltage conversion amplifier 62 is set so as to be lowered as the level of the detection current which is of the input signal is increased, the amplitude ΔV of the detection voltage Vd output from the current-to-voltage conversion amplifier 62 when the unnecessary direct-current bias component is added by the disturbance noise. As shown by the detection current Id3, in the case where the disturbance noise is large enough to exceed the input dynamic range of the current-to-voltage conversion amplifier 62, the amplitude becomes zero and the signal component does not emerge in the detection voltage Vd3 as shown in FIG. 19C. In order to widen the dynamic range while the same gain is maintained, it is necessary to increase the power supply voltage Vcc. However, this contradicts the demand for lowering the power supply voltage and lowering power consumption.

Therefore, in the light receiver 100 of the embodiment, the input/output property of the current-to-voltage conversion amplifier 62 is set so as to be able to amplify the detection current Id which is generated in inputting the upper-limit level signal regarded as the sum of the infrared signal and the disturbance noise to the photodiode 10.

Figure 20:
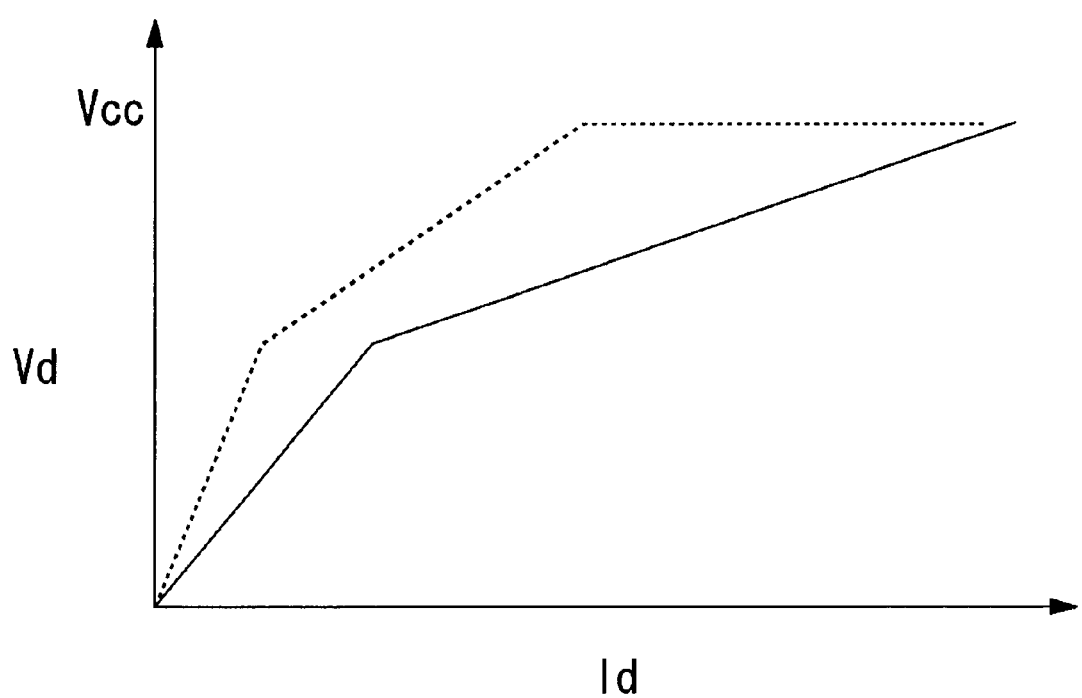
FIG. 20 is a view for explaining setting of the input/output property of the current-to-voltage conversion amplifier shown in FIG. 17.

FIG. 20 is a view for explaining the setting of the input/output property of the current-to-voltage conversion amplifier 62. As described above, the gain of the current-to-voltage conversion amplifier 62 can be adjusted by the first resistor R31 and the second resistor R32. The input/output property shown in FIGS. 19A to 19C is shown by a broken line of FIG. 20, and the input/output property of the current-to-voltage conversion amplifier 62 of the embodiment is shown by a solid line of FIG. 20.

Thus, the gain of the current-to-voltage conversion amplifier 62 of the embodiment is set low by setting the first resistor R31 and the second resistor R32 to the low resistance values, and thereby the input dynamic range is widely set.

Referring again to FIG. 16, the distributing unit 64 distributes the detection voltage Vd output from the current-to-voltage conversion amplifier 62 into first and second plural paths. The first DC blocking capacitor C1 and the second DC blocking capacitor C2 are provided to prevent the direct current in the first and second paths respectively. The direct-current component of the detection voltage Vd is removed by the first DC blocking capacitor C1 and the second DC blocking capacitor C2. Hereinafter, the detection voltage whose direct-current component is removed is designated by the reference symbol Vd'.

Figure 21:
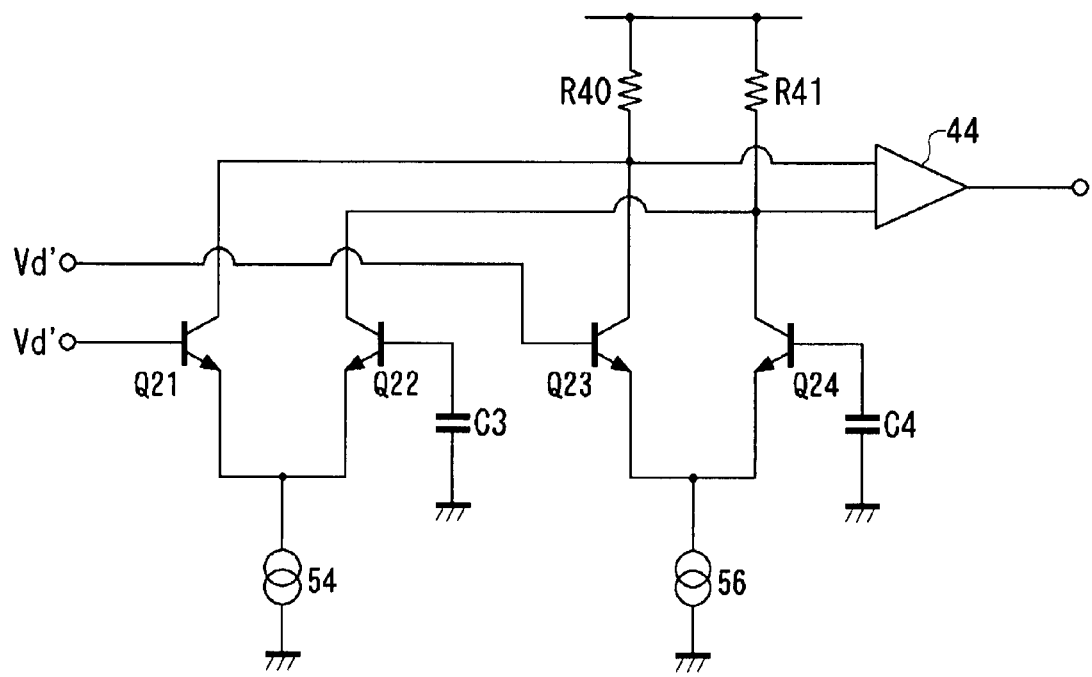
FIG. 21 is a circuit diagram showing a configuration example of an adder and an amplifier of FIG. 16.

The adder 66 adds the plural detection voltages Vd which is distributed by the distributing unit 64 and in which direct-current components of the plural detection voltages Vd' are removed. FIG. 21 is a circuit diagram showing a configuration example of the adder 66 and the amplifier 68.

The adder 66 and the amplifier 68 include a first transistor Q21 to a fourth transistor Q24, a first current source 54, a second current source 56, resistors R40 and R41, and an amplifying stage 44. The first and second transistors Q21 and Q22 constitute a first differential pair, and the third and fourth transistors Q23 and Q24 constitute a second differential pair. The resistors R40 and R41 are loads which are commonly provided for the first and second differential pairs. The first current source 54 and the second current source 56 supply a bias current to the first and second differential pairs. The detection voltages Vd' in which the direct-current components of the detection voltages Vd' are removed by the first DC blocking capacitor C1 and second DC blocking capacitor C2 shown in FIG. 16 are input to the bases of the first and third transistors Q21 and Q23. The bases of the second and fourth transistors Q22 and Q24 are alternating-current-grounded by capacitors C3 and C4.

When the detection voltage Vd' is changed, differential currents are generated in the first and second differential pairs. The differential currents generated in the first and second differential pairs flow the resistors R40 and R41 which are of the loads, and are added. The amplifying stage 44 amplifies the voltages emerging at the resistors R40 and R41 and outputs the amplified voltages. The resistors R40 and R41 may be formed as current mirror loads including the two transistors. The NPN type bipolar transistor and the PNP type bipolar transistor may mutually be replaced with each other, or the NPN type bipolar transistor and the PNP type bipolar transistor may be replaced with the MOS transistor.

Referring again to FIG. 16, after the adder 66 and the amplifier 68 add and amplify the detection voltage Vd', the adder 66 and the amplifier 68 output the signal to the subsequent bandpass filter 74. The bandpass filter 74 removes the bands except for the carrier frequency and output the signal to the demodulator 70.

The demodulator 70 demodulates the pulse-position-modulated signal to perform the waveform shaping, and outputs the demodulated signal to the control unit 72. The control unit 72 controls the electronic equipment provided with the light receiver 100 based on the demodulated signal.

The operation of the light receiver 100 of the embodiment having the above configuration will be described.

When the infrared signal is incident to the photodiode 10, the detection current Id flows through the photodiode 10. The detection current Id becomes the sum of the direct-current component Ibias by the external noise and the signal component Isig. The voltage conversion of the detection current Id is performed by the current-to-voltage conversion amplifier 62, and the current-to-voltage conversion amplifier 62 outputs the detection voltage Vd. The distributing unit 64 distributes the detection voltage Vd into two paths which include the first DC blocking capacitor C1 and the second DC blocking capacitor C2. The detection voltages Vd1 whose direct-current components are removed by the first DC blocking capacitor C1 and second DC blocking capacitor C2 are added by the adder 66 and amplified by the amplifier 68.

FIGS. 22A to 22C show the state in which the signal is amplified by the current-to-voltage conversion amplifier 62 when the gain is set low as shown by a solid line in FIG. 20. FIGS. 22A to 22C correspond to FIGS. 19A to 19C. As described above, in the light receiver 100 according to the embodiment, the gain of the current-to-voltage conversion amplifier 62 is set low in order to widen the input dynamic range. Accordingly, as shown in FIG. 22C, when the external noise is small, the amplitudes ΔV1 and ΔV2 of the detection voltage Vd output from the current-to-voltage conversion amplifier 62 are smaller than the amplitudes ΔV1 and ΔV2 of FIG. 19C.

The detection voltage Vd is distributed into the two paths by the distributing unit 64, and the direct-current components generated by the external noise are removed. The adder 66 adds the amplitude component ΔV obtained by the removal of the direct-current component. For example, in the case where the gain of the current-to-voltage conversion amplifier 62 is set to ½ of the case in which the distributing unit 64 is not provided, the amplitude component ΔV of the detection voltage Vd also becomes ½. However, the amplitude component ΔV output from the adder 66 becomes double because of the addition, so that the gain of the current-to-voltage conversion amplifier 62 is equalized to the gain in the case in which the distributing unit 64 is not provided.

In the light receiver 100 according to the embodiment, the input dynamic range is widened by setting the gain of the current-to-voltage conversion amplifier 62 to the low. Therefore, when compared with the case in which the gain of the current-to-voltage conversion amplifier 62 is set to the high, the infrared signal can be detected even under the condition of the large bias component Ibias caused by the external noise.

In the light receiver 100 of the embodiment, because the amplitude is doubled by the addition, the S/N ratio can be prevented from being worsened compared with the case in which the gain of the subsequent amplifier is doubled. That is, in the case where the gain of the amplifier is doubled, the S/N ratio is worsened because the gain of the noise component such as a thermal noise output from the current-to-voltage conversion amplifier 62 is doubled. On the contrary, in the case where the amplitude is doubled by the addition, the S/N ratio can be improved because the noise component becomes √2 times.

The above embodiment is described only by way of example, and it is understood for those skilled in the art that various modifications can be made by combinations of components and processes, the modification will be within the scope of the invention.

For example, in the embodiment, the output of the current-to-voltage conversion amplifier 62 is distributed into the two paths by the distributing unit 64, and distributed outputs are input to the first DC blocking capacitor C1 and the second DC blocking capacitor C2. Alternatively, a configuration shown in FIG. 23 may be adopted.

Figure 23:
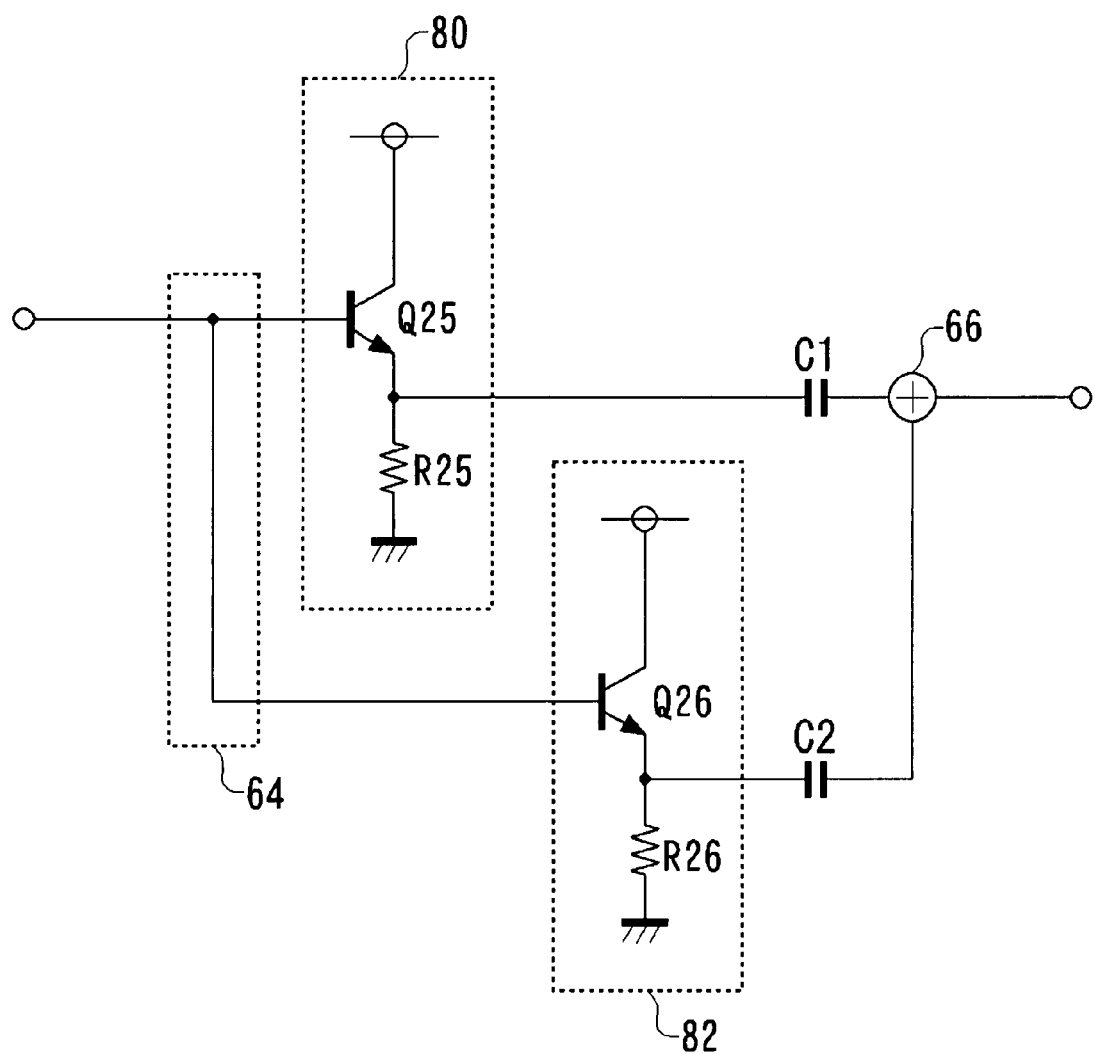
FIG. 23 is a circuit diagram showing apart of a modification of the light receiver shown in FIG. 16.

FIG. 23 is a circuit diagram showing apart of a configuration of the light receiver 100. The two paths include buffer circuits 80 and 82 in the preceding stages of the first DC blocking capacitor C1 and second DC blocking capacitor C2 respectively. The buffer circuit 80 includes a transistor Q25 and a resistor R25. The base of the transistor Q25 is connected to the distributing unit 64, the emitter of the transistor Q25 is connected to the resistor R25, and the power supply voltage Vcc is applied to the collector of the transistor Q25. The buffer circuit 82 also includes a transistor Q26 and a resistor R26 and configured similar to the buffer 80.

Thus, providing the buffer circuits 80 and 52 in the preceding stages of the first DC blocking capacitor C1 and second DC blocking capacitor C2 enables impedance to be set high when the subsequent stage is viewed from the current-to-voltage conversion amplifier 62, so that the circuit can be operated more stably.

In the embodiment, the adder 66 is formed with the plurality of differential pairs as shown in FIG. 21. However, the invention is not limited thereto, but another configuration may be adopted. For example, the adder 66 may be formed by a general summing amplifier in which the two resistors are connected to the inverting input terminal of the operational amplifier while the signal is input to the other end of each resistor. In the embodiment, the distributing unit 64 distributes the detection voltage Vd output from the current-to-voltage conversion amplifier 62 into the two paths. However, the invention is not limited thereto, but the distributing unit 64 distributes the detection voltage Vd into three paths or more. In this case, in the adder 66 of FIG. 21, it is necessary to add the differential pairs corresponding to each path.

In the current-to-voltage conversion amplifier 62, it is not always necessary to perform the gain compression, but the gain may be kept constant in the effective dynamic range.

Additionally, the following modifications and application are perceived in the first to third embodiments.

Although the photodiode 10 is used as the light receiving element in the first to third embodiments as an example, an avalanche photodiode, a phototransistor, and the like may be used as the light receiving element. The invention is not limited to the light receiving element, but the invention can be applied to photoelectric conversion elements such as CCD (Charge Coupled Device).

In the first to third embodiments, descriptions are made by the light receiving element which receives the optical signal as an example. However, the invention is not limited to thereto. The invention can widely be applied to the receivers, in which a magnetic sensitive element, which detects a magnetic signal, and the sensitive element such as a microphone and a piezoelectric element, which detect the vibration to convert the vibration into the electric signal, are used.

In the first to third embodiments, the components constituting the light receiver 100 may integrally be formed, the components may be formed while divided into integrated circuits, or a part of the components may be formed by a discrete component. Which components are integrated may be determined according to cost, an occupied area, an application, and the like.

While the preferred embodiments of the present invention have been described using specific terms, such description is for illustrative purposes only, and it is to be understood that changes and variations may be made without departing from the spirit or scope of the appended claims.

What is claimed is:

1. A receiver comprising:
a sensitive element which receives a signal from the outside to convert the signal into an electric signal and outputs the electric signal;
an amplifier which amplifies the electric signal output from the sensitive element;
a distributing unit which distributes the electric signal amplified by the amplifier into a plurality of paths; and
an adder which adds the plurality of electric signals distributed by the distributing unit;
wherein the adder comprises a differential amplifier, the differential amplifier comprising:
a plurality of differential pairs;
a load which is commonly provided for the plurality of differential pairs; and
a plurality of current sources which supply bias currents to the plurality of differential pairs respectively, and
the adder inputs the plurality of electric signals distributed by the distributing unit, to the plurality of differential pairs respectively.

2. The receiver according to claim 1, wherein the adder performs addition after direct-current components of the plurality of electric signals are removed.

3. The receiver according to claim 1, wherein the plurality of paths include DC blocking capacitors.

4. The receiver according to claim 1, wherein a gain of the amplifier is set so as to be lowered as a level of the electric signal output from the sensitive element is increased.

5. The receiver according to claim 1, wherein plurality of paths include buffer circuits respectively.

6. The receiver according to claim 1, wherein the sensitive element is a light receiving element which receives an optical signal to convert the optical signal into an electric signal and outputs the electric signal.

7. The receiver according to claim 6, wherein the light receiving element outputs a detection current according to an amount of light received in a form of the electric signal,
the amplifier converts the detection current into a detection voltage and amplified the detection voltage, and
the adder adds the voltages of the plurality of electric signals.

8. The receiver according to claim 1, wherein the sensitive element, the amplifier, the distributing unit, and the adder are integrated on one semiconductor integrated circuit.

9. The receiver according to claim 1, wherein the sensitive element, the amplifier, the distributing unit, and the adder are incorporated into one package.

10. An electronic equipment which is remotely controlled from the outside using an infrared signal, the electronic equipment comprising:
a receiver which receives a pulse-modulated infrared signal which is incident from the outside;
a demodulation unit which demodulates the infrared signal received by the receiver; and
a control unit which controls operation of the electronic equipment based on the infrared signal demodulated by the demodulation unit,
the receiver comprising:
a sensitive element which receives a signal from the outside to convert the signal into a detection current and outputs the detection current;
a distributing unit which distributes the detection current output from the sensitive element in a form of a plurality of detection currents;
a plurality of amplifiers respectively provided for the plurality of detection currents, each amplifier being adapted to convert the corresponding detection current distributed by the distributing unit into a detection voltage, and the amplifiers having different current-to-voltage conversion gains; and
an adder which adds the plurality of detection voltages output from the plurality of amplifiers.

11. The electronic equipment according to claim 10, wherein
the current-to-voltage conversion gains of the plurality of amplifiers are set such that the plurality of amplifiers differ from one another in a range of signal level in which the distributed detection current can significantly be amplified.

12. The electronic equipment according to claim 10, wherein
the sensitive element is a light receiving element which receives an optical signal to convert the optical signal into detection current and outputs the detection current.

13. The electronic equipment according to claim 10, further comprising a plurality of capacitors for preventing a direct current, each of the capacitors being provided on signal path from an output of a corresponding one of the plurality of amplifiers to the adder.

14. The electronic equipment according to claim 13, wherein
the adder performs addition after direct-current components of the plurality of detection voltages amplified by the plurality of amplifiers are removed by the plurality of capacitors.

15. An electronic equipment which is remotely controlled from the outside using an infrared signal, the electronic equipment comprising:
a receiver which receives a pulse-modulated infrared signal which is incident from the outside;
a demodulation unit which demodulates the infrared signal received by the receiver; and
a control unit which controls operation of the electronic equipment based on the infrared signal demodulated by the demodulation unit;
the receiver comprising:
a plurality of sensitive elements which convert input signals into electric signals to output the electric signals;
a plurality of amplifiers which amplify the plurality of electric signals output from the plurality of sensitive elements; and
an adder which adds the plurality of electric signals amplified by the plurality of amplifiers;
wherein gains of the amplifiers are set so as to be lowered in steps as a level of the electric signal output from the sensitive element is increased, and
sizes of the plurality of sensitive elements are set such that the level of the electric signal is included in a range where the amplifier which amplifies the electric signal has a significant gain, the electric signal being output when the maximum signal regarded as an input is input.

16. The electronic equipment according to claim 15, wherein
the sensitive element is a light receiving element which receives an optical signal to convert the optical signal into the electric signal and outputs the electric signal.

17. The electronic equipment according to claim 16, wherein the plurality of light receiving element output a plurality of detection currents according to an amount of light received in a form of the electric signal, the plurality of amplifiers convert the plurality of detection currents into a plurality of detection voltages, and the adder adds the plurality of detection voltages.

18. The electronic equipment according to claim 15, wherein
the adder performs addition after direct-current components of the plurality of electric signals amplified by the plurality of amplifiers are removed.

19. An electronic equipment which is remotely controlled from the outside using an infrared signal, the electronic equipment comprising:
a receiver which receives a pulse-modulated infrared signal which is incident from the outside;
a demodulation unit which demodulates the infrared signal received by the receiver; and
a control unit which controls operation of the electronic equipment based on the infrared signal demodulated by the demodulation unit;
the receiver comprising:
a sensitive element which receives a signal from the outside to convert the signal into an electric signal and outputs the electric signal;
an amplifier which amplifies the electric signal output from the sensitive element;
a distributing unit which distributes the electric signal amplified by the amplifier into a plurality of paths; and
an adder which adds the plurality of electric signals distributed by the distributing unit;
wherein the adder comprises a differential amplifier, the differential amplifier comprising:
a plurality of differential pairs;
a load that is commonly provided for the plurality of differential pairs; and
a plurality of current sources which supply bias currents to the plurality of differential pairs respectively;
wherein the adder inputs the plurality of electric signals distributed by the distributing unit, to the plurality of differential pairs respectively.

20. The electronic equipment according to claim 19, wherein the light receiving element outputs a detection current according to an amount of light received in a form of the electric signal, the amplifier converts the detection current into a detection voltage and amplified the detection voltage, and the adder adds the voltages of the plurality of electric signals.

21. A receiver comprising:
a sensitive element which receives a signal from the outside to convert the signal into an electric signal and outputs the electric signal;
an amplifier which amplifies the electric signal output from the sensitive element;
a distributing unit which distributes the electric signal amplified by the amplifier into a plurality of paths; and
an adder which adds the plurality of electric signals distributed by the distributing unit;
wherein the amplifier comprises:
an operational amplifier in which a reference voltage is input to a non-inverting input terminal of the operational amplifier and the electric signal output from the sensitive element is input to an inverting input terminal of the operational amplifier;
a first resistor provided between an output terminal of the operational amplifier and the inverting input terminal of the operational amplifier;
a diode having an anode thereof connected to the output terminal of the operational amplifier; and
a second resistor provided between the cathode of the diode and the inverting input terminal of the operational amplifier.

* * * * *